US 9,697,886 B2
Jul. 4, 2017

(12) United States Patent
Yabuuchi et al.

(54) SEMICONDUCTOR STORAGE DEVICE

(71) Applicant: Renesas Electronics Corporation, Koutou-ku, Tokyo (JP)

(72) Inventors: Makoto Yabuuchi, Tokyo (JP); Shinji Tanaka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/211,364

(22) Filed: Jul. 15, 2016

(65) Prior Publication Data
US 2017/0076783 A1   Mar. 16, 2017

(30) Foreign Application Priority Data
Sep. 15, 2015   (JP) .................. 2015-181823

(51) Int. Cl.
*G11C 11/00*   (2006.01)
*G11C 11/417*   (2006.01)

(52) U.S. Cl.
CPC .................. *G11C 11/417* (2013.01)

(58) Field of Classification Search
CPC .......... G11C 2207/2227; G11C 11/406; G11C 11/40615; G11C 14/00; G11C 2211/4067; G11C 5/14; G11C 5/145; G11C 5/147; G11C 2207/2281; G11C 7/22; G11C 11/413; G11C 11/417; G11C 5/148; G11C 7/1006; G11C 7/1039; G11C 29/028
USPC .......... 365/227, 222, 226, 228, 229, 189.09, 365/189.07, 203, 233.1, 189.011, 189.05, 365/194, 195, 202, 205, 207, 45, 51
See application file for complete search history.

(56) References Cited

U.S. PATENT DOCUMENTS

2013/0021832 A1*   1/2013   Yamaki .................. G11C 5/148
                                                              365/51

FOREIGN PATENT DOCUMENTS

JP           2013-025843 A      2/2013

* cited by examiner

*Primary Examiner* — Thong Q Le
(74) *Attorney, Agent, or Firm* — Shapiro, Gabor and Rosenberger, PLLC

(10) Patent No.: US 9,697,886 B2
(45) Date of Patent: Jul. 4, 2017

(57) ABSTRACT

A semiconductor storage device having a plurality of low power consumption modes is provided.
The semiconductor storage device includes a plurality of memory modules where a plurality of low power consumption modes can be set and cancelled based on a first and a second control signals. At least a part of memory modules of the plurality of memory modules have a propagation path that propagates an inputted first control signal to a post stage memory module. The second control signal is inputted into each of the plurality of memory modules in parallel. Setting and cancelling of the first low power consumption mode of each memory module are performed based on a combination of the first control signal that is propagated through the propagation path and the second control signal. Setting and cancelling of the second low power consumption mode, in which regions where a power source is shut down are different from those in the first low power consumption mode, of each memory module are sequentially performed according to the first control signal that is propagated through the propagation path.

10 Claims, 22 Drawing Sheets

NORMAL

FIRST LOW POWER CONSUMPTION MODE

SECOND LOW POWER CONSUMPTION MODE

THIRD LOW POWER CONSUMPTION MODE

FOURTH LOW POWER CONSUMPTION MODE

SEMICONDUCTOR STORAGE DEVICE

CROSS-REFERENCE TO RELATED APPLICATIONS

The disclosure of Japanese Patent Application No. 2015-181823 filed on Sep. 15, 2015 including the specification, drawings and abstract is incorporated herein by reference in its entirety.

BACKGROUND

The present disclosure relates to a semiconductor storage device in which a plurality of memory modules having a low power consumption mode are formed.

When a low power consumption mode set in a semiconductor storage device is cancelled, power supply is started to a circuit to which the power supply has been stopped and an operation of the circuit whose operation has been stopped is restarted, so that an inrush current occurs in the circuit and a ground level rises in an undesired manner. This may cause a failure due to electromigration or may cause a malfunction due to variation of a logical threshold level. In particular, in a case in which storage capacity of the memory modules mounted in the semiconductor storage device increases, when a low power consumption state of a large number of memory modules is cancelled, a particularly large inrush current occurs. Various techniques for alleviating the inrush current that occurs when the low power consumption mode is cancelled are proposed.

In this regard, Japanese Unexamined Patent Application Publication No. 2013-25843 proposes a method which cancels the low power consumption mode by delaying a control signal and sequentially propagating the control signal to post stage memory modules.

SUMMARY

On the other hand, in recent years, it is possible to efficiently operate a semiconductor storage device in accordance with a situation by providing a plurality of low power consumption modes.

However, providing a wiring to delay a control signal for each low power consumption mode causes a circuit design to be complicated, so that a load of product design is too large.

Other objects and novel features will become apparent from the description of the present specification and the accompanying drawings.

According to an embodiment, a semiconductor storage device includes a plurality of memory modules where a plurality of low power consumption modes can be set and cancelled based on a first and a second control signals. At least a part of memory modules of the plurality of memory modules have a propagation path that propagates an inputted first control signal to a post stage memory module. The second control signal is inputted into each of the plurality of memory modules in parallel. Setting and cancelling of the first low power consumption mode of each memory module are performed based on a combination of the first control signal that is propagated through the propagation path and the second control signal. Setting and cancelling of the second low power consumption mode, in which regions where a power source is shut down are different from those in the first low power consumption mode, of each memory module are sequentially performed according to the first control signal that is propagated through the propagation path.

According to the embodiment, it is possible to perform setting and cancelling of a plurality of low power consumption modes according to a combination of the propagated first control signal and the second control signal.

DETAILED DESCRIPTION

Figure 1:
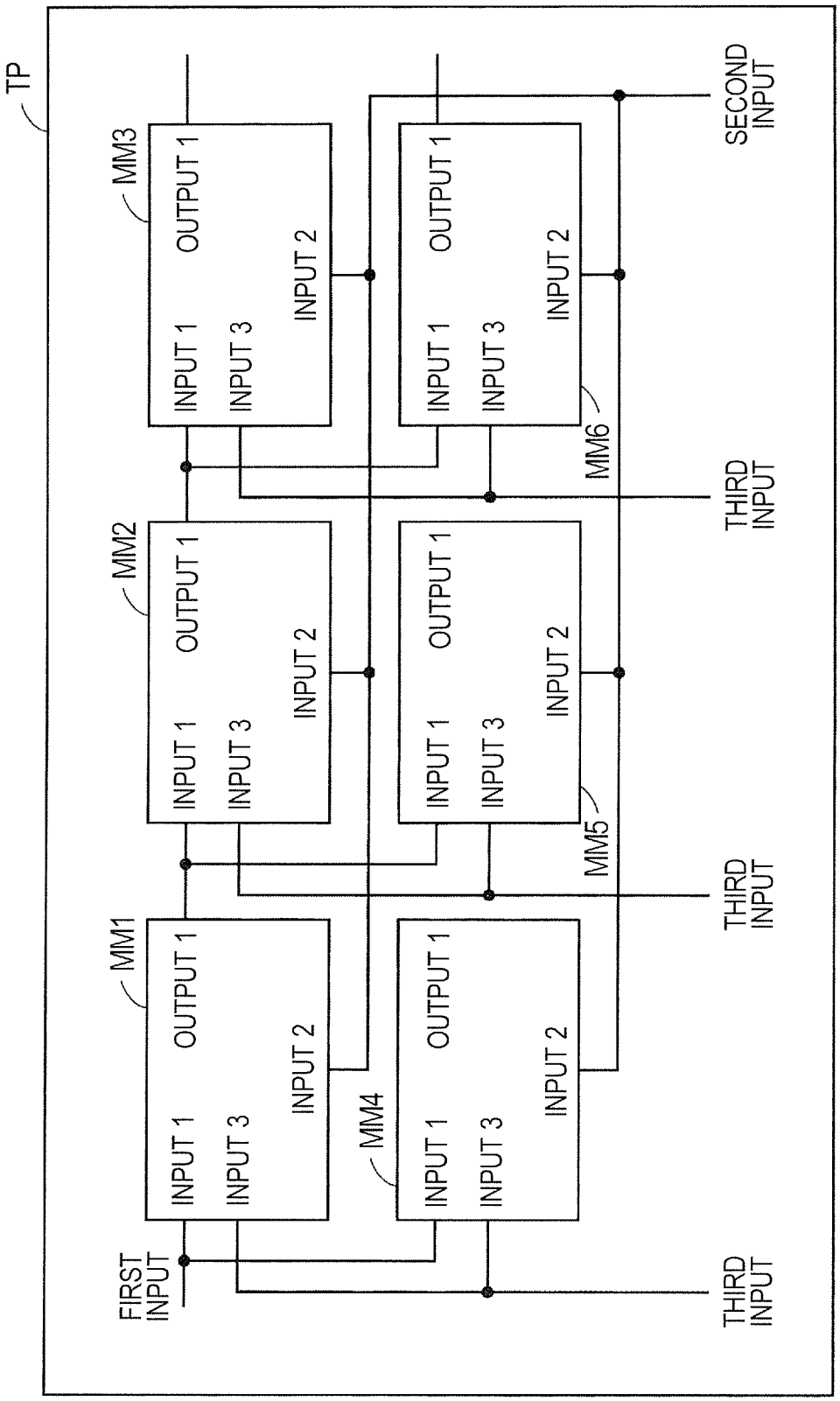
FIG. 1 is a diagram for explaining an outline of a semiconductor storage device based on a first embodiment.

Embodiments will be described in detail with reference to the drawings. In the drawings, the same or corresponding components are denoted by the same reference numerals and the description thereof will not be repeated.

First Embodiment

FIG. 1 is a diagram for explaining an outline of a semiconductor storage device based on a first embodiment.

As shown in FIG. 1, a semiconductor storage device TP is provided with a plurality of memory modules MM1 to MM6 (hereinafter also collectively referred to as memory modules MM).

In this example, each memory module MM is configured so that a plurality of low power consumption modes can be set and cancelled.

Specifically, each memory module MM is provided with inputs 1 to 3 and is configured to be able to set and cancel a plurality of low power consumption modes according to control signals of the inputs 1 to 3 given to the inputs 1 to 3 respectively.

As an example, the control signal of the first input is inputted into the input 1 of the memory module MM1 and is outputted from an output 1 through a propagation path in the memory module. The control signal of the first input becomes a delayed signal by the propagation path. The output 1 is coupled with the input 1 of the post stage memory module MM2. The control signal inputted into the input 1 of the memory module MM2 is outputted from an output 1 through a propagation path in the memory module. In the same manner, the output 1 is coupled with the input 1 of the post stage memory module MM3. Thereafter, in the same manner, the delayed control signal is propagated and inputted into the post stage memory module MM.

Regarding the control signal of the first input that is inputted into the input 1, the same coupling relationship is also established for the memory modules MM4 to MM6.

The control signal of the second input is inputted into the input 2 of each memory module in parallel.

The control signal of the third input is inputted into the input 3 of each memory module in parallel.

In this example, a method of performing setting and cancelling of a plurality of low power consumption modes based on a plurality of control signals for a plurality of memory modules MM included in the semiconductor storage device TP will be described.

FIGS. 2A to 2E are diagrams for explaining the plurality of low power consumption modes.

Figure 2A:
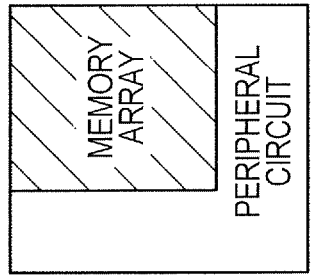
FIGS. 2A to 2E are diagrams for explaining a plurality of low power consumption modes.

FIG. 2A shows a memory module MM in a normal mode.

The memory module MM mainly includes a memory array and a peripheral circuit for driving the memory array.

In the normal mode, normal power supply is performed to each of the memory array and the peripheral circuit.

In the low power consumption mode, a region and/or an amount where the power is supplied vary.

Figure 2B:
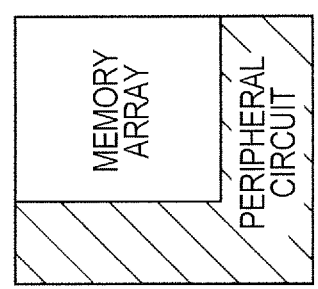

FIG. 2B shows a memory module MM in a first low power consumption mode.

In the first low power consumption mode, the power supply to each of the memory array and the peripheral circuit is shut down. In this case, the power supply is shut down, so that information in the memory array disappears.

Figure 2C:
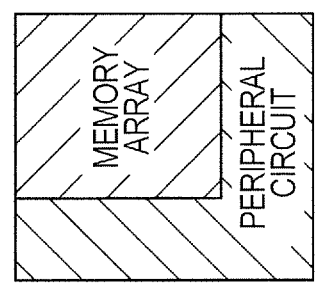

FIG. 2C shows a memory module MM in a second low power consumption mode.

In the second low power consumption mode, the power supply to the peripheral circuit is shut down. The power supply to the memory array is lowered. In this case, the power supply to the memory array is maintained, so that it is possible to maintain the information.

Figure 2D:
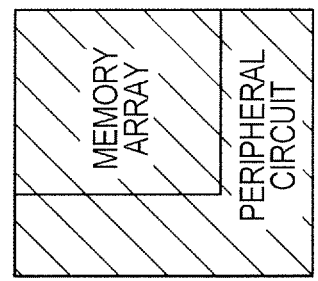

FIG. 2D shows a memory module MM in a third low power consumption mode.

In the third low power consumption mode, the power supply to the peripheral circuit is shut down. Normal power supply is performed to the memory array. As compared with the second low power consumption mode, normal power supply is maintained for the memory array. Therefore, when returning the memory module MM to the normal mode, only the power supply to the peripheral circuit is restored, so that it is possible to reduce restoration time.

Figure 2E:
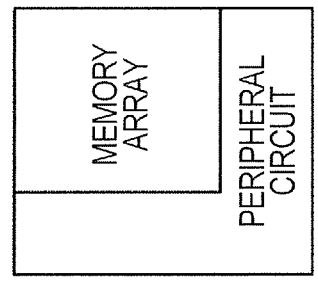

FIG. 2E shows a memory module MM in a fourth low power consumption mode.

In the fourth low power consumption mode, normal power supply is performed to the peripheral circuit. The power supply to the memory array is shut down. As compared with the second low power consumption mode, normal power supply is maintained for the peripheral circuit. Therefore, when returning the memory module MM to the normal mode, only the power supply to the memory array is restored, so that it is possible to reduce restoration time.

In the fourth low power consumption mode, information in the memory array is not maintained.

Figure 3:
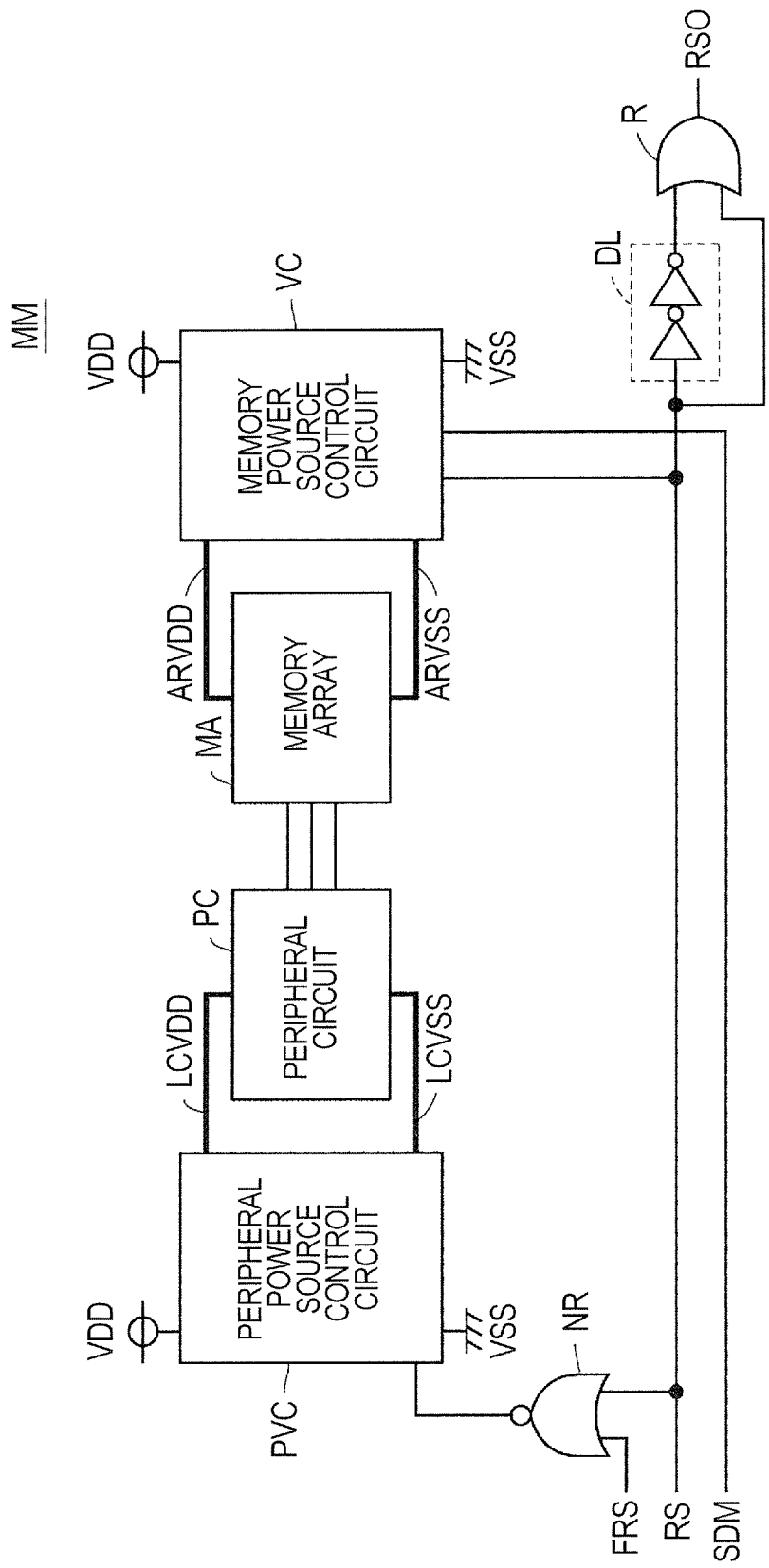
FIG. 3 is a diagram for explaining functional blocks of a memory module MM based on the first embodiment.

FIG. 3 is a diagram for explaining functional blocks of the memory module MM based on the first embodiment.

As shown in FIG. 3, the memory module MM includes a memory array MA, a peripheral circuit PC, a memory power source control circuit VC for controlling power supply of the memory array MA, and a peripheral power source control circuit PVC for controlling power supply of the peripheral circuit PC.

The memory power source control circuit VC is coupled with a power source voltage VDD and a ground voltage VSS and controls voltages of a memory power source line ARVDD and a memory ground line ARVSS according to inputted first input control signal RS and second input control signal SDM.

The peripheral power source control circuit PVC is coupled with the power source voltage VDD and the ground voltage VSS and controls voltages of a peripheral power source line LCVDD and a peripheral ground line LCVSS according to inputted first input control signal RS and third input control signal FRS. Specifically, the peripheral power source control circuit PVC receives an output from a NOR circuit NR for the inputs of the control signal RS and the control signal FRS and controls the voltages of the peripheral power source line LCVDD and the peripheral ground line LCVSS.

A propagation path through which the first input control signal RS is propagated is provided in the memory module MM and the control signal RS is outputted to the outside as a control signal RSO. Specifically, an OR circuit R that receives the input of the control signal RS and an input of the control signal RS which has passed through a delay element DL is provided and the control signal RSO is outputted from the OR circuit R. As described above, the control signal RSO is inputted as the first input control signal RS of the post stage memory module MM. Here, an example is described in which the delay element DL including two inverters is provided in the propagation path. However, the delay element is not limited to this, and it is possible to further provide a delay element for adjusting the amount of delay. The control signal RSO rises in the same manner as the control signal RS rises from "L" level to "H" level, and the fall of the control signal RSO from "H" level to "L" level delays according to the amount of delay of the delay element DL.

In this example, the setting and the cancelling of the first low power consumption mode of the memory module MM are performed based on a combination of the first input control signal RS and the second input control signal SDM.

The setting and the cancelling of the second low power consumption mode of the memory module MM are performed based on the input of the first input control signal RS.

The setting and the cancelling of the third low power consumption mode of the memory module MM are performed based on the input of the third input control signal FRS.

Figure 4:
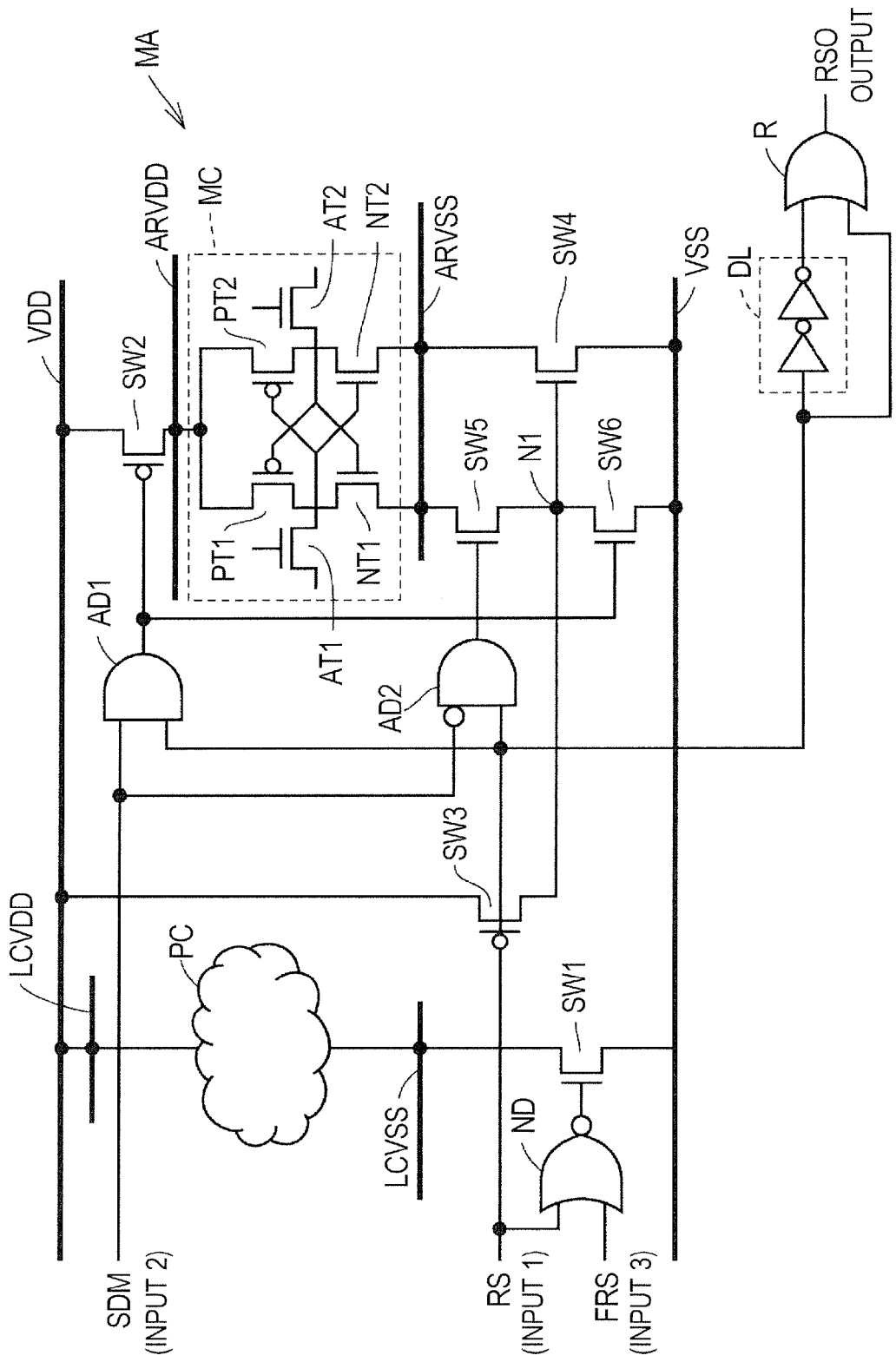
FIG. 4 is a diagram for explaining a circuit configuration related to power supply of the memory module MM based on the first embodiment.

FIG. 4 is a diagram for explaining a circuit configuration related to power supply of the memory module MM based on the first embodiment.

As shown in FIG. 4, the peripheral circuit PC is coupled with the peripheral power source line LCVDD and the peripheral ground line LCVSS. As the peripheral power source control circuit PVC, an N-channel MOS transistor SW1 is provided between the peripheral power source line LCVDD and the ground voltage VSS and the N-channel MOS transistor SW1 receives an input of an output signal of the NOR circuit NR.

The NOR circuit NR receives inputs of the control signal RS and the control signal FRS and outputs a NOR logical operation result of these signals to the N-channel MOS transistor SW1.

In the initial state, the control signal RS and the control signal FRS are "L" level.

Therefore, the NOR circuit NR outputs an "H" level signal to the N-channel MOS transistor SW1. Therefore, in the initial state, the N-channel MOS transistor SW1 is in an ON state and the peripheral ground line LCVSS is coupled with the ground voltage VSS.

On the other hand, when either one of the control signal RS and the control signal FRS is activated to "H" level, the NOR circuit NR outputs an "L" level signal to the N-channel MOS transistor SW1. Therefore, the N-channel MOS transistor SW1 becomes an OFF state and the peripheral ground line LCVSS is separated from the ground voltage VSS.

The memory array MA includes a plurality of memory cells MC. In this example, one memory cell MC is shown.

Each memory cell MC is coupled with the memory power source line ARVDD and the memory ground line ARVSS. In the memory cell MC, a six-transistor SRAM (Static Random Access Memory) cell is shown. Specifically, a P-channel MOS transistor PT1 and an N-channel MOS transistor NT1 are coupled between the memory power source line ARVDD and the memory ground line ARVSS. A P-channel MOS transistor PT2 and an N-channel MOS transistor NT2 are coupled between the memory power source line ARVDD and the memory ground line ARVSS.

The gates of the P-channel MOS transistor PT1 and the N-channel MOS transistor NT1 are coupled with a coupling node of the P-channel MOS transistor PT2 and the N-channel MOS transistor NT2. The coupling node is coupled with an access transistor AT2.

The gates of the P-channel MOS transistor PT2 and the N-channel MOS transistor NT2 are coupled with a coupling node of the P-channel MOS transistor PT1 and the N-channel MOS transistor NT1. The coupling node is coupled with an access transistor AT1.

The memory cell MC is a normal SRAM cell, so that a detailed description of its operation and the like will be omitted.

As the memory power source control circuit VC, AND circuits AD1 and AD2, P-channel MOS transistors SW2 and SW3, and N-channel MOS transistors SW4 to SW6 are provided.

The P-channel MOS transistor SW2 is provided between the power source voltage VDD and the memory power source line ARVDD. The gate of the P-channel MOS transistor SW2 receives an output of the AND circuit AD1. The AND circuit AD1 receives inputs of the control signal SDM and the control signal RS and outputs an AND logical operation result of these signals to the gates of the P-channel MOS transistor SW2 and the N-channel MOS transistor SW6.

The N-channel MOS transistor SW4 is provided between the memory ground line ARVSS and the ground voltage VSS. The gate of the N-channel MOS transistor SW4 is coupled with a node N1.

The N-channel MOS transistor SW5 is provided between the memory ground line ARVSS and the node N1. The gate of the N-channel MOS transistor SW5 receives an output of the AND circuit AD2.

The N-channel MOS transistor SW6 is provided between the ground voltage VSS and the node N1. The gate of the N-channel MOS transistor SW6 receives an output of the AND circuit AD1.

The P-channel MOS transistor SW3 is provided between the power source voltage VDD and the node N1. The gate of the P-channel MOS transistor SW3 receives an input of the control signal RS.

The AND circuit AD2 receives an input of an inversion signal of the control signal SDM and an input of the control signal RS and outputs an AND logical operation result of these signals to the gate of the N-channel MOS transistor SW5.

In the initial state, the control signal RS and the control signal SDM are "L" level.

Therefore, the AND circuit AD1 outputs an "L" level signal to the P-channel MOS transistor SW2. Therefore, in the initial state, the P-channel MOS transistor SW2 is in an ON state and the peripheral ground line LCVSS is coupled with the ground voltage VSS.

Further, the P-channel MOS transistor SW3 is in an ON state and the node N1 is coupled with the power source voltage VDD to be set to "H" level.

Therefore, the N-channel MOS transistor SW4 is in an ON state and the peripheral ground line LCVSS is coupled with the ground voltage VSS.

On the other hand, the outputs of the AND circuits AD1 and AD2 are "L" level, so that both the N-channel MOS transistors SW5 and SW6 are in an OFF state.

Next, when the control signal SDM is "L" level and the control signal RS is activated to "H" level, the P-channel MOS transistor SW3 becomes an OFF state. The AND circuit AD1 maintains "L" level and the P-channel MOS transistor SW2 is an ON state. The N-channel MOS transistor SW6 is an OFF state.

The AND circuit AD2 is set to "H" level and the N-channel MOS transistor SW5 becomes an ON state. Therefore, the node N1 and the memory ground line ARVSS are coupled together. The N-channel MOS transistor SW4 becomes a diode-coupled state in which the source and the gate are coupled together, and the potential of the memory ground line ARVSS is set to a state in which the potential is a little above the ground voltage VSS (a state in which the potential is high). Thereby, it is possible to reduce a leakage current of the memory cell MC and reduce the power consumption.

Next, when the control signal SDM is "H" level and the control signal RS is activated to "H" level, the P-channel MOS transistor SW3 becomes an OFF state. The AND circuit AD1 is set to "H" level and the P-channel MOS transistor SW2 becomes an OFF state. The N-channel MOS transistor SW6 becomes an ON state. Therefore, the node N1 and the ground voltage VSS are coupled together. Therefore, the N-channel MOS transistor SW4 becomes an OFF state. The AND circuit AD2 is set to "L" level and the N-channel MOS transistor SW5 becomes an OFF state.

Thereby, the P-channel MOS transistor SW2 and the N-channel MOS transistor SW4 become an OFF state and the power supply to the memory array MA is shut down.

Figure 5:
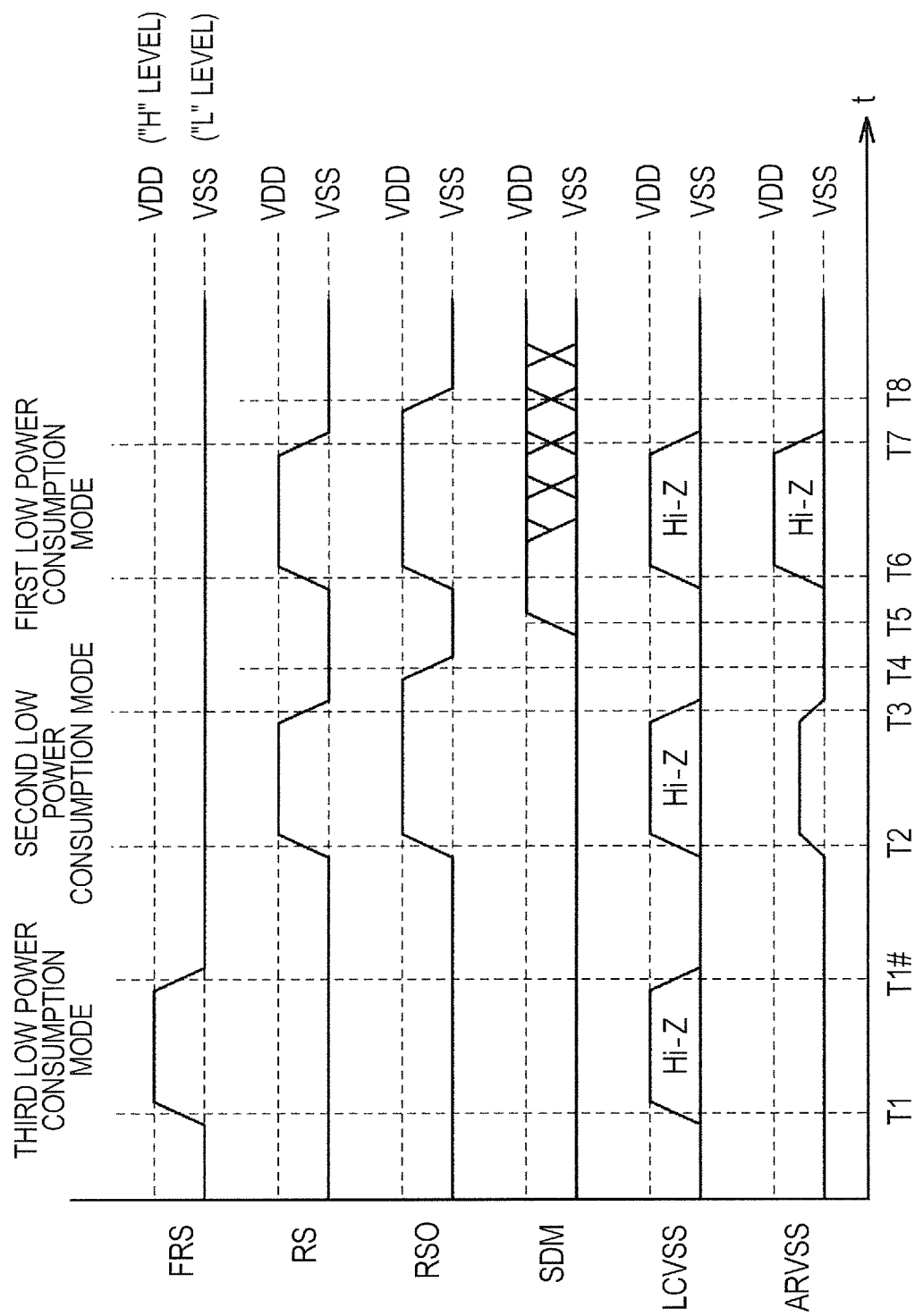
FIG. 5 is a diagram for explaining a timing chart for explaining low power consumption modes of the memory module MM based on the first embodiment.

FIG. 5 is a diagram for explaining a timing chart for explaining the low power consumption modes of the memory module MM based on the first embodiment.

As show in FIG. 5, at time T1, a case in which the control signal FRS is activated to "H" level is shown. Accordingly, the peripheral ground line LCVSS is separated from the ground voltage VSS and the potential of the peripheral ground line LCVSS becomes a high impedance (Hi-Z) state, the case of which is shown.

On the other hand, a state in which the memory ground line ARVSS is coupled with the ground voltage VSS is maintained.

Thereby, it is possible to set the third low power consumption mode in which the power supply to the peripheral circuit is shut down and normal power supply is maintained for the memory array.

At time T1#, a case in which the control signal FRS is deactivated is shown. Accordingly, the peripheral ground line LCVSS is coupled with the ground voltage VSS, the case of which is shown.

A return operation from the third low power consumption mode to the normal mode is to restore the power supply to the peripheral circuit. The power to be restored is small, so that it is possible to quickly perform the return operation without considering inrush current.

At time T2, a case in which the control signal RS is activated to "H" level is shown. Accordingly, the peripheral ground line LCVSS is separated from the ground voltage VSS and the potential of the peripheral ground line LCVSS becomes a high impedance (Hi-Z) state, the case of which is shown.

Further, the N-channel MOS transistor SW4 becomes a diode-coupled state and the memory ground line ARVSS is set to a state in which the memory ground line ARVSS is a little above the ground voltage VSS (a state in which the potential is high).

Thereby, it is possible to set the second low power consumption mode in which the power supply to the peripheral circuit is shut down and the power supply to the memory array is lower than the normal power supply.

At time T3, a case in which the control signal RS is deactivated is shown. Accordingly, the peripheral ground line LCVSS is coupled with the ground voltage VSS, the case of which is shown. Further, a case is shown in which the memory ground line ARVSS is coupled with the ground voltage VSS.

The control signal RSO is a delayed control signal RS, and a case in which the control signal RSO is deactivated at time T4 is shown. The control signal RSO is outputted to the post stage memory module, so that regarding a return operation from the second low power consumption mode to the normal mode, the return operation is performed step by step from a previous stage memory module to a post stage memory module. Therefore, it is possible to alleviate inrush current that occurs when the low power consumption mode is cancelled.

At time T5, a case in which the control signal SDM is activated to "H" level is shown. In this case, the low power consumption mode is not enabled by only the control signal SDM.

At time T6, a case in which the control signal RS is activated is shown. Accordingly, the peripheral ground line LCVSS is separated from the ground voltage VSS and the potential of the peripheral ground line LCVSS becomes a high impedance (Hi-Z) state, the case of which is shown.

Further, regarding the memory ground line ARVSS, the N-channel MOS transistor SW6 becomes an ON state and the N-channel MOS transistor SW4 becomes an OFF state. Therefore, the memory ground line ARVSS is separated from the ground voltage VSS and the potential of the memory ground line ARVSS becomes a high impedance (Hi-Z) state, the case of which is shown.

Thereby, the power supply to the peripheral circuit and the memory array is shut down, so that the first low power consumption mode can be set.

At time T7, a case in which the control signal RS is deactivated is shown. Accordingly, the peripheral ground line LCVSS is coupled with the ground voltage VSS, the case of which is shown. Further, a case is shown in which the memory ground line ARVSS is coupled with the ground voltage VSS.

The control signal RSO is a delayed control signal RS, and a case in which the control signal RSO is deactivated at time T8 is shown. The control signal RSO is outputted to the post stage memory module, so that regarding a return operation from the first low power consumption mode to the normal mode, the return operation is performed step by step from a previous stage memory module to a post stage memory module. Therefore, it is possible to alleviate inrush current that occurs when the low power consumption mode is cancelled.

As described above, the setting and the cancelling of the first low power consumption mode of the memory module MM are performed based on a combination of the first input control signal RS and the second input control signal SDM. Further, the setting and the cancelling of the second low power consumption mode of the memory module MM are performed based on the input of the first input control signal RS. Further, the setting and the cancelling of the third low power consumption mode of the memory module MM are performed based on the input of the third input control signal FRS.

A return operation from the first and the second low power consumption modes to the normal mode is performed according to the control signal RS and the control signal RSO which is a delayed signal of the control signal RS. In other words, the return operation is performed step by step from a previous stage memory module to a post stage memory module.

That is to say, it is not necessary to generate a delayed signal obtained by delaying the control signal for each of the plurality of low power consumption modes, and by performing the setting and the cancelling of a low power consumption mode based on a combination of the low power consumption mode and one delayed signal, it is possible to alleviate inrush current that occurs when each of the plurality of low power consumption modes is cancelled.

Thereby, it is not necessary to provide a wiring to delay the control signal for each low power consumption mode, it is possible to design a circuit with a simple configuration, and it is possible to reduce the load of designing a product.

Second Embodiment

Figure 6:
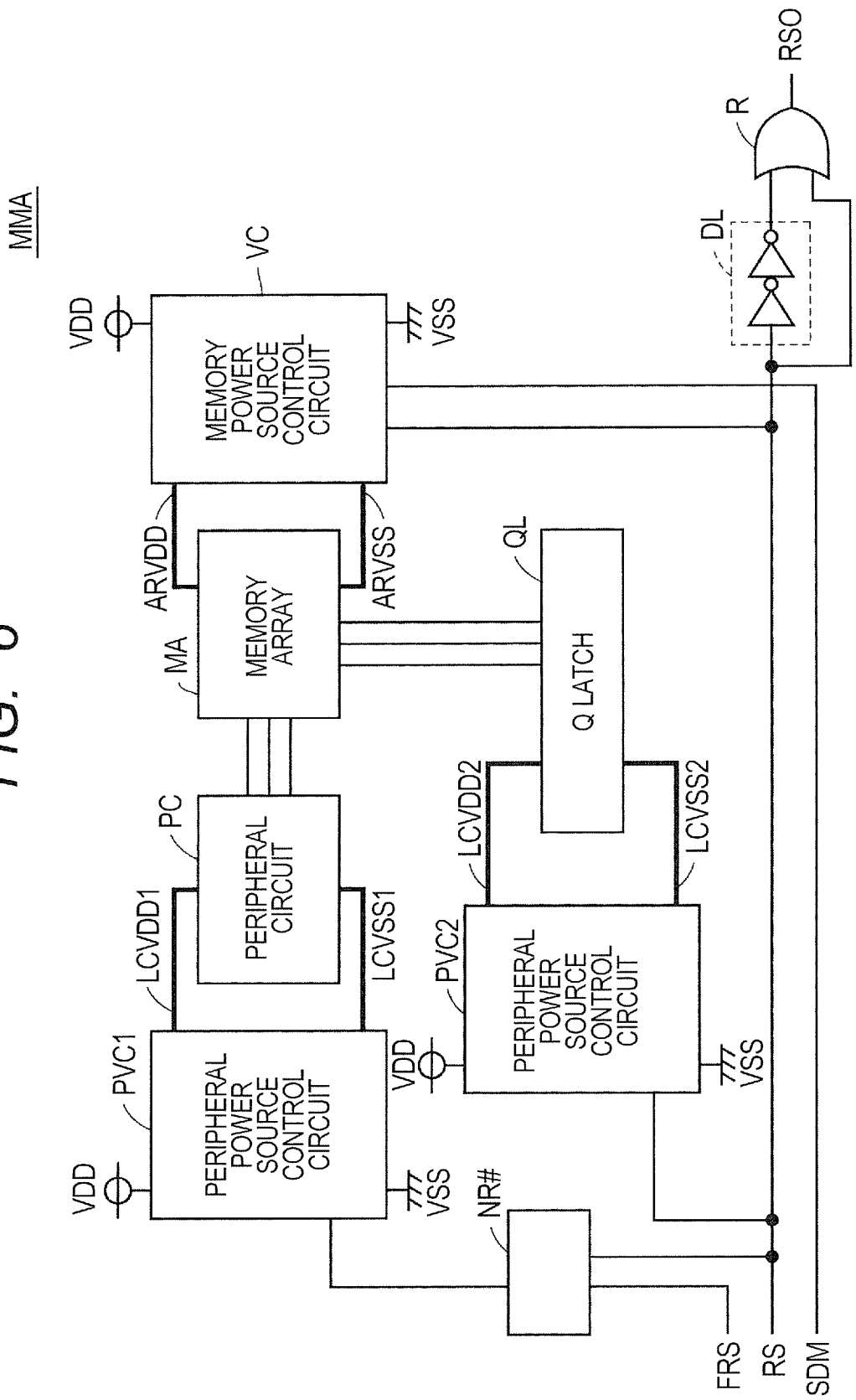
FIG. 6 is a diagram for explaining functional blocks of a memory module MMA based on a second embodiment.

FIG. 6 is a diagram for explaining functional blocks of a memory module MMA based on a second embodiment.

As shown in FIG. 6, the memory module MMA is different from the memory module MM described in FIG. 3 in a point that a Q latch QL is further provided.

The Q latch QL has a function to hold data outputted from the memory array MA.

In this example, a peripheral power source control circuit PVC1 for controlling power supply to the peripheral circuit PC other than the Q latch QL and a peripheral power source control circuit PVC2 for controlling power supply to the Q latch QL are provided.

The peripheral power source control circuit PVC1 is coupled with the power source voltage VDD and the ground voltage VSS and controls voltages of a peripheral power source line LCVDD1 and a peripheral ground line LCVSS1 according to inputted first input control signal RS and third input control signal FRS. Specifically, the peripheral power source control circuit PVC1 receives an output from a circuit NR# for the inputs of the control signal RS and the control signal FRS and controls the voltages of the peripheral power source line LCVDD1 and the peripheral ground line LCVSS1.

The peripheral power source control circuit PVC2 is coupled with the power source voltage VDD and the ground voltage VSS and controls voltages of a peripheral power source line LCVDD2 and a peripheral ground line LCVSS2 according to the inputted first input control signal RS.

The other configuration is the same as the configuration of the memory module described in FIG. 3, so that the detailed description thereof will not be repeated.

Figure 7:
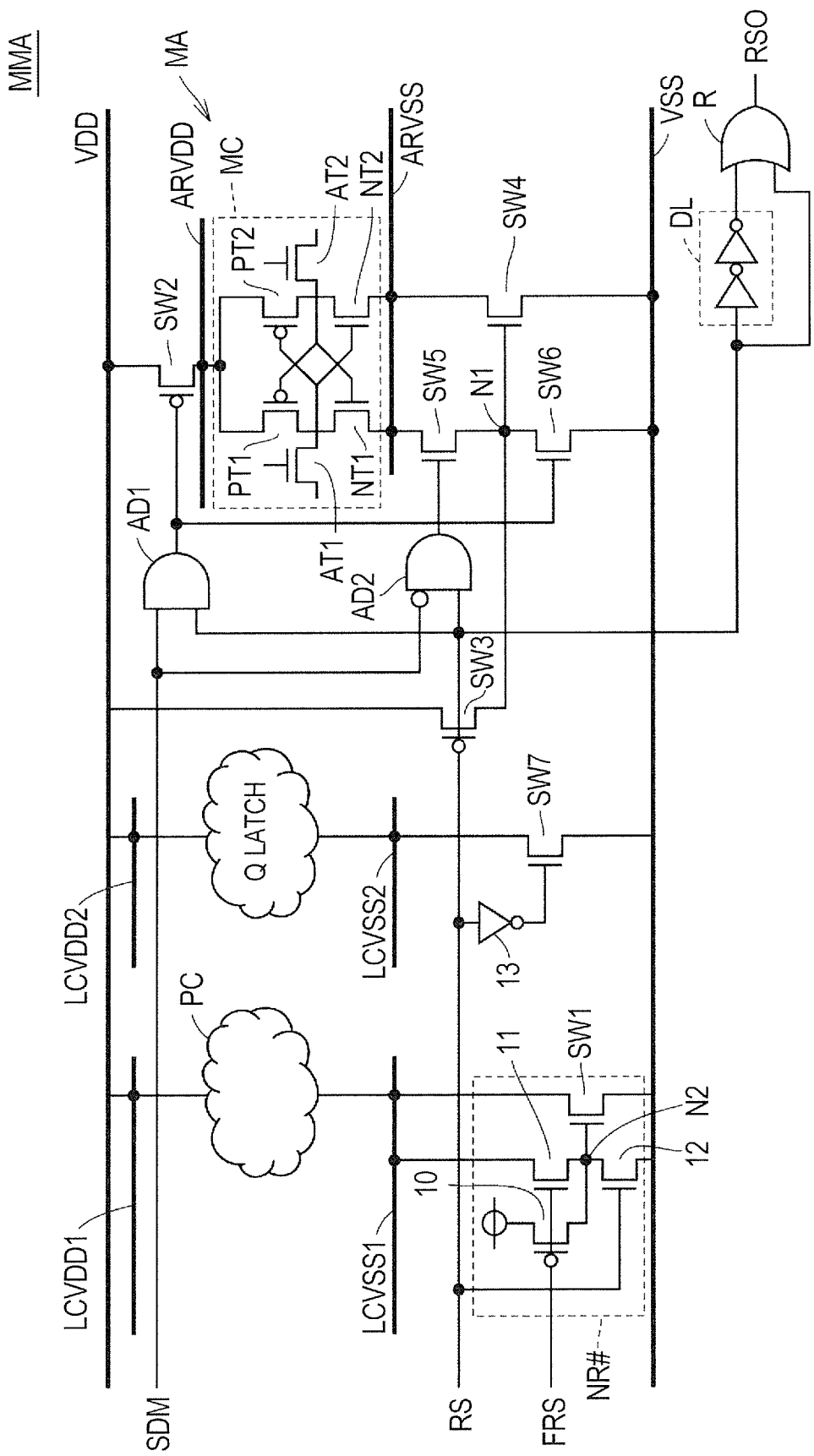
FIG. 7 is a diagram for explaining a circuit configuration related to power supply of the memory module MMA based on the second embodiment.

FIG. 7 is a diagram for explaining a circuit configuration related to power supply of the memory module MMA based on the second embodiment.

As shown in FIG. 7, the memory module MMA has the same configuration of the memory array MA and the memory power source control circuit VC as that of the circuit described in FIG. 4 and the other configuration of the memory module MMA is different from that of the circuit described in FIG. 4.

Specifically, the circuit NR# is provided instead of the NOR circuit NR.

Further, a configuration of the Q latch QL and the peripheral power source control circuit PVC2 is newly provided.

Regarding the peripheral power source line and the peripheral ground line, the peripheral power source line LCVDD1 and the peripheral ground line LCVSS1 are provided corresponding to the peripheral circuit PC. Further, the peripheral power source line LCVDD2 and the peripheral ground line LCVSS2 are provided corresponding to the Q latch QL.

An N-channel MOS transistor SW1 is provided between the peripheral power source line LCVDD1 and the ground voltage VSS and the gate of the N-channel MOS transistor SW1 is coupled with a node N2 of the circuit NR#.

The circuit NR# includes a P-channel MOS transistor 10 and N-channel MOS transistors 11 and 12.

The P-channel MOS transistor 10 is provided between the power source voltage VDD and the node N2. The gate of the P-channel MOS transistor 10 receives an input of the control signal FRS.

The N-channel MOS transistor 11 is provided between the peripheral ground line LCVSS1 and the node N2. The gate of the N-channel MOS transistor 11 receives an input of the control signal FRS.

The N-channel MOS transistor 12 is provided between the ground voltage VSS and the node N2. The gate of the N-channel MOS transistor 12 receives an input of the control signal RS.

In the initial state, the control signal RS and the control signal FRS are "L" level.

Therefore, the circuit NR# outputs a "H" level signal to the N-channel MOS transistor SW1. Therefore, in the initial state, the N-channel MOS transistor SW1 is in an ON state and the peripheral ground line LCVSS is coupled with the ground voltage VSS.

When the control signal RS is activated to "H" level, the N-channel MOS transistor 12 becomes an ON state, the N-channel MOS transistor SW1 becomes an OFF state, and the peripheral ground line LCVSS1 is separated from the ground voltage VSS.

When the control signal FRS is activated to "H" level, the N-channel MOS transistor 11 becomes an ON state. Thereby, the node N2 and the peripheral ground line LCVSS1 are coupled together. The N-channel MOS transistor SW1 becomes a diode-coupled state in which the source and the gate are coupled together, and the potential of the peripheral ground line LCVSS1 is set to a state in which the potential is a little above the ground voltage VSS (a state in which the potential is high).

Figure 8:
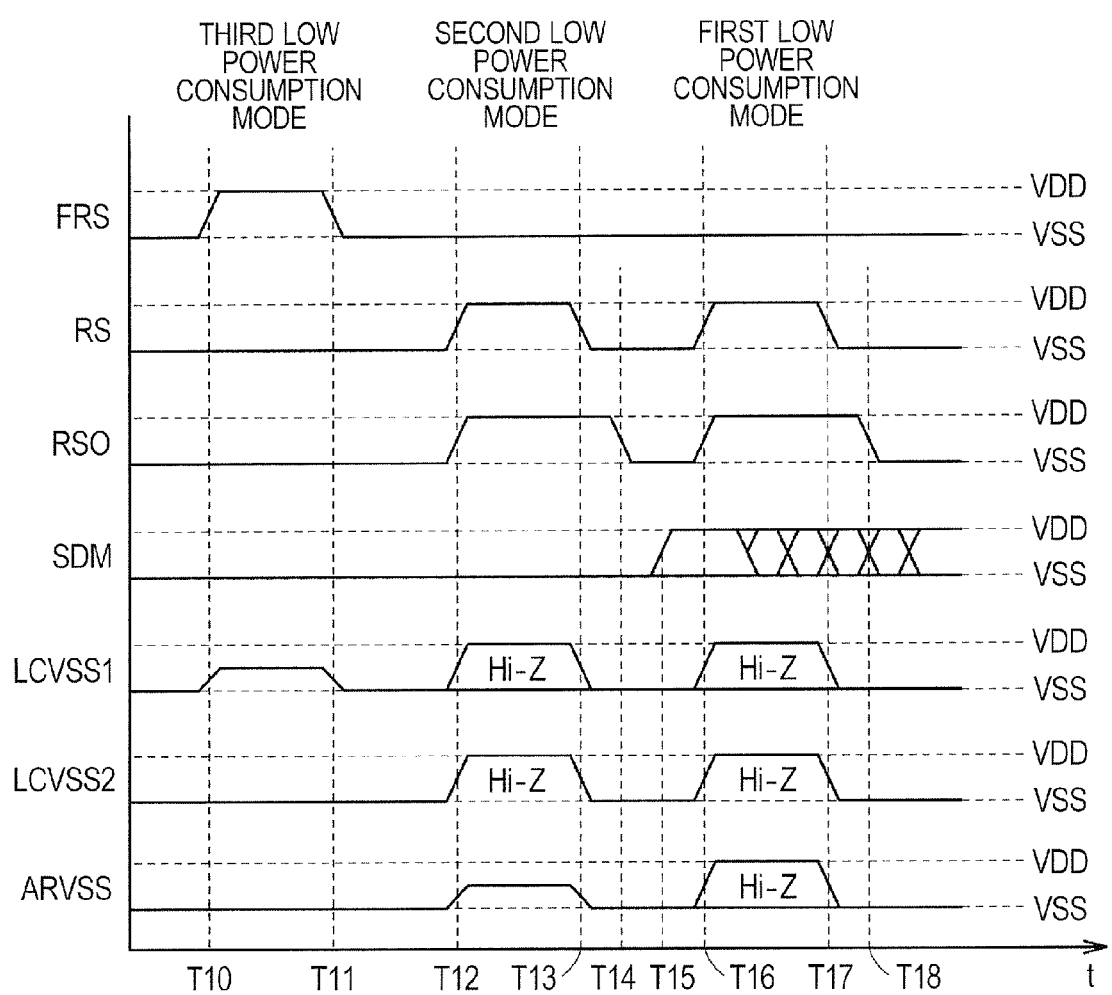
FIG. 8 is a diagram for explaining a timing chart for explaining low power consumption modes of the memory module MMA based on the second embodiment.

FIG. 8 is a diagram for explaining a timing chart for explaining the low power consumption modes of the memory module MM based on the second embodiment.

As show in FIG. 8, at time T10, a case in which the control signal FRS is activated to "H" level is shown. Accordingly, the N-channel MOS transistor 11 becomes an ON state. Therefore, the N-channel MOS transistor SW1 becomes a diode-coupled state in which the source and the gate are coupled together, and the potential of the peripheral ground line LCVSS1 is set to a state in which the potential is a little above the ground voltage VSS (a state in which the potential is high).

The peripheral ground line LCVSS2 maintains a state of being coupled with the ground voltage VSS.

Thereby, the power supply of the peripheral circuit PC is reduced. It is possible to set the third low power consumption mode in which normal power supply is maintained for the Q latch and the memory array.

At time T11, a case in which the control signal FRS is deactivated is shown. Accordingly, the peripheral ground line LCVSS1 is coupled with the ground voltage VSS, the case of which is shown.

A return operation from the third low power consumption mode to the normal mode is to restore the power supply to the peripheral circuit. The power to be restored is small and the inrush current is small, so that it is possible to quickly perform the return operation.

The third low power consumption mode of this example is to reduce the power supply for only a part of region of the peripheral circuit and to maintain the normal power supply for regions other than the above.

At time T12, a case in which the control signal RS is activated to "H" level is shown. Accordingly, the peripheral ground line LCVSS1 is separated from the ground voltage VSS and the potential of the peripheral ground line LCVSS1 becomes a high impedance (Hi-Z) state, the case of which is shown.

Further, the peripheral ground line LCVSS2 is separated from the ground voltage VSS and the potential of the peripheral ground line LCVSS2 becomes a high impedance (Hi-Z) state, the case of which is shown.

Further, the N-channel MOS transistor SW4 becomes a diode-coupled state and the memory ground line ARVSS is set to a state in which the memory ground line ARVSS is a little above the ground voltage VSS (a state in which the potential is high).

Thereby, it is possible to set the second low power consumption mode in which the power supply to the peripheral circuit and the Q latch is shut down and the power supply to the memory array is lower than the normal power supply.

At time T13, a case in which the control signal RS is deactivated is shown. Accordingly, the peripheral ground lines LCVSS1 and the LCVSS2 are coupled with the ground voltage VSS, the case of which is shown. Further, a case is shown in which the memory ground line ARVSS is coupled with the ground voltage VSS.

The control signal RSO is a delayed control signal RS, and a case in which the control signal RSO is deactivated at time T14 is shown. The control signal RSO is outputted to the post stage memory module, so that regarding a return operation from the second low power consumption mode to the normal mode, the return operation is performed step by step from a previous stage memory module to a post stage memory module. Therefore, it is possible to alleviate inrush current that occurs when the low power consumption mode is cancelled.

At time T15, a case in which the control signal SDM is activated to "H" level is shown. In this case, the low power consumption mode is not enabled by only the control signal SDM.

At time T16, a case in which the control signal RS is activated is shown. Accordingly, the peripheral ground lines LCVSS1 and LCVSS2 are separated from the ground voltage VSS and the potential of the peripheral ground lines LCVSS1 and LCVSS2 becomes a high impedance (Hi-Z) state, the case of which is shown.

Further, regarding the memory ground line ARVSS, the N-channel MOS transistor SW6 becomes an ON state and the N-channel MOS transistor SW4 becomes an OFF state. Therefore, the memory ground line ARVSS is separated from the ground voltage VSS and the potential of the memory ground line ARVSS becomes a high impedance (Hi-Z) state, the case of which is shown.

Thereby, the power supply to the peripheral circuit, the Q latch, and the memory array is shut down, so that the first low power consumption mode can be set.

At time T17, a case in which the control signal RS is deactivated is shown. Accordingly, the peripheral ground lines LCVSS1 and the LCVSS2 are coupled with the ground voltage VSS, the case of which is shown. Further, a case is shown in which the memory ground line ARVSS is coupled with the ground voltage VSS.

The control signal RSO is a delayed control signal RS, and a case in which the control signal RSO is deactivated at time T18 is shown. The control signal RSO is outputted to the post stage memory module, so that regarding a return operation from the first low power consumption mode to the normal mode, the return operation is performed step by step from a previous stage memory module to a post stage memory module. Therefore, it is possible to alleviate inrush current that occurs when the low power consumption mode is cancelled.

As described above, the setting and the cancelling of the first low power consumption mode of the memory module MMA are performed based on a combination of the first input control signal RS and the second input control signal SDM. Further, the setting and the cancelling of the second low power consumption mode of the memory module MMA are performed based on the input of the first input control signal RS. Further, the setting and the cancelling of the third low power consumption mode of the memory module MMA are performed based on the input of the third input control signal FRS.

A return operation from the first and the second low power consumption modes to the normal mode is performed according to the control signal RS and the control signal RSO which is a delayed signal of the control signal RS. In other words, the return operation is performed step by step from a previous stage memory module to a post stage memory module.

That is to say, it is not necessary to generate a delayed signal obtained by delaying the control signal for each of the plurality of low power consumption modes, and by performing the setting and the cancelling of a low power consumption mode based on a combination of the low power consumption mode and one delayed signal, it is possible to alleviate inrush current that occurs when each of the plurality of low power consumption modes is cancelled.

Thereby, it is not necessary to provide a wiring to delay the control signal for each low power consumption mode, it is possible to design a circuit with a simple configuration, and it is possible to reduce the load of designing a product.

Third Embodiment

Figure 9:
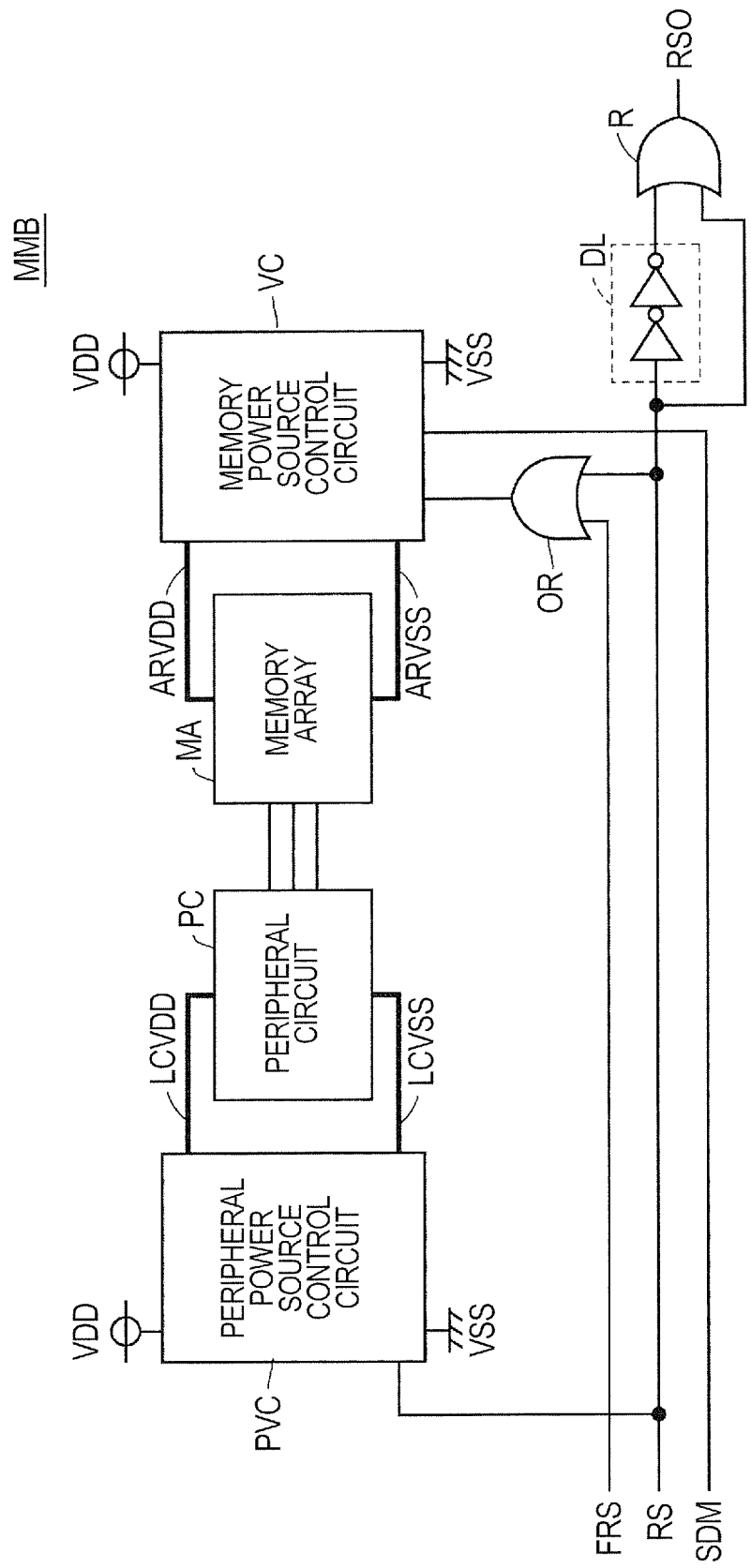
FIG. 9 is a diagram for explaining functional blocks of a memory module MMB based on a third embodiment.

FIG. 9 is a diagram for explaining functional blocks of a memory module MMB based on a third embodiment.

As shown in FIG. 9, the memory module MMB is different from the memory module MM described in FIG. 3 in a point that an OR circuit OR is provided instead of the NOR circuit NR and the inputs of the control signals are different from those in the memory module MM.

Specifically, the control signal RS is inputted into the peripheral power source control circuit PVC.

The output signal of the OR circuit OR of the control signal FRS and the control signal RS is inputted into the memory power source control circuit VC.

In this example, the peripheral power source control circuit PVC1 is coupled with the power source voltage VDD and the ground voltage VSS and controls voltages of the peripheral power source line LCVDD1 and the peripheral ground line LCVSS1 according to the inputted first input control signal RS.

The memory power source control circuit VC receives the output from the OR circuit OR for the inputs of the control signal RS and the control signal FRS and controls the voltages of the memory power source line ARVDD and the memory ground line ARVSS. The other configuration is the same as the configuration of the memory module described in FIG. 3, so that the detailed description thereof will not be repeated.

Figure 10:
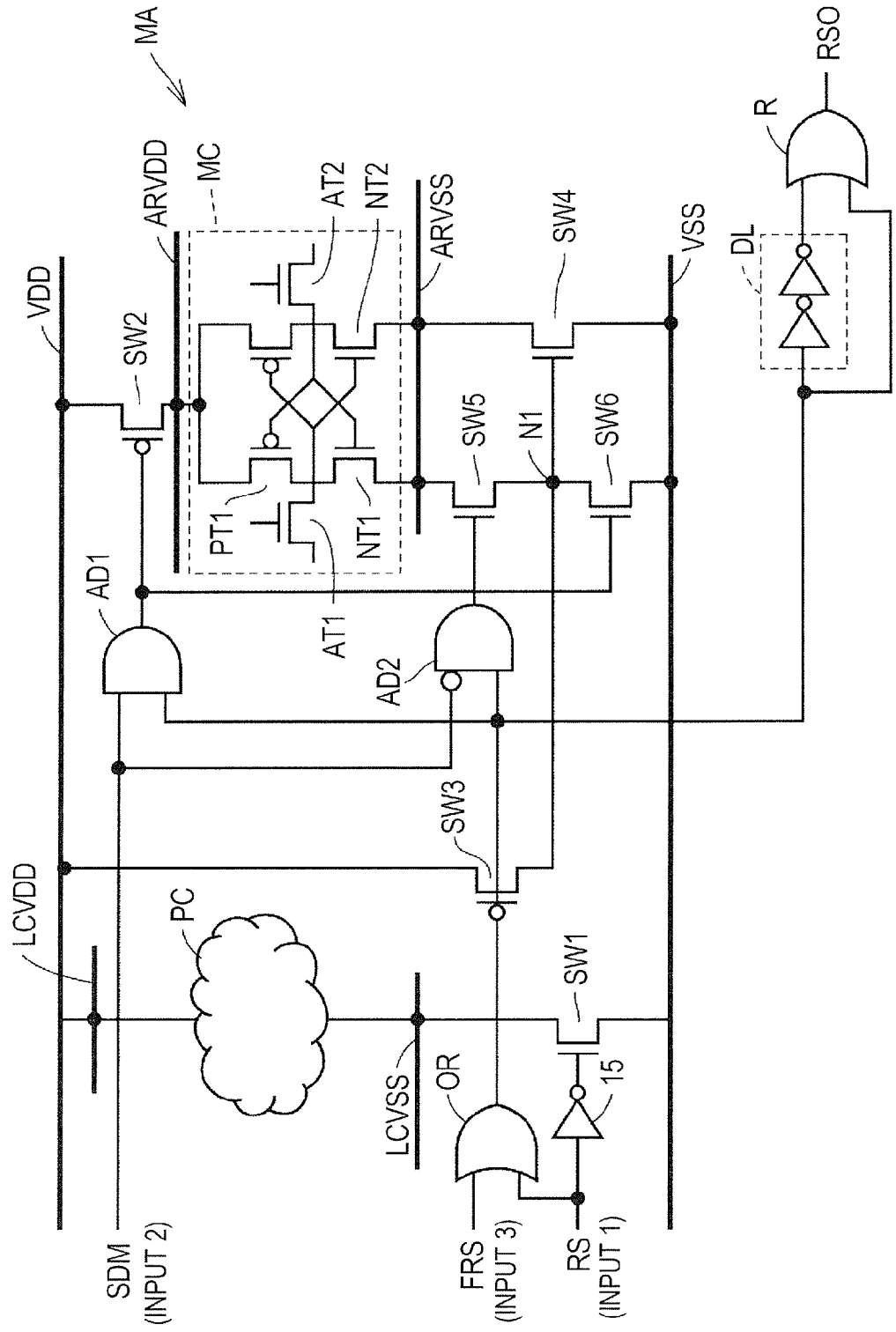
FIG. 10 is a diagram for explaining a circuit configuration related to power supply of the memory module MMB based on the third embodiment.

FIG. 10 is a diagram for explaining a circuit configuration related to power supply of the memory module MMB based on the third embodiment.

As shown in FIG. 10, the circuit configuration of the memory module MMB is different from the circuit configuration described in FIG. 4 in the inputs of the memory power source control circuit VC and the peripheral power source control circuit PVC.

Specifically, the N-channel MOS transistor SW1 of the peripheral power source control circuit PVC receives an input of the control signal RS through an inverter 15. The memory power source control circuit VC receives an output of an OR logical operation result of the OR circuit OR that receives inputs of the control signal FRS and the control signal RS.

In the initial state, the control signal RS and the control signal FRS are "L" level.

Therefore, the N-channel MOS transistor SW1 is in an ON state and the peripheral ground line LCVSS is coupled with the ground voltage VSS.

Next, when the control signal SDM is "L" level and the control signal RS is activated to "H" level, the N-channel MOS transistor SW1 becomes an OFF state and the peripheral ground line LCVSS is separated from the ground voltage VSS.

When the control signal RS is activated to "H" level, the P-channel MOS transistor SW3 becomes an OFF state. The AND circuit AD1 maintains "L" level and the P-channel MOS transistor SW2 is an ON state. The N-channel MOS transistor SW6 is an OFF state. The AND circuit AD2 is set to "H" level and the N-channel MOS transistor SW5 becomes an ON state. Therefore, the node N1 and the memory ground line ARVSS are coupled together. The N-channel MOS transistor SW4 becomes a diode-coupled state in which the source and the gate are coupled together, and the potential of the memory ground line ARVSS is set to a state in which the potential is a little above the ground voltage VSS (a state in which the potential is high). Thereby, it is possible to reduce a leakage current of the memory cell MC and reduce the power consumption.

Next, when the control signal SDM is "H" level and the control signal RS is activated to "H" level, the P-channel MOS transistor SW3 becomes an OFF state. The AND circuit AD1 is set to "H" level and the P-channel MOS transistor SW2 becomes an OFF state. The N-channel MOS transistor SW6 becomes an ON state. Therefore, the node N1 and the ground voltage VSS are coupled together. Therefore, the N-channel MOS transistor SW4 becomes an OFF state. The AND circuit AD2 is set to "L" level and the N-channel MOS transistor SW5 becomes an OFF state. Thereby, the P-channel MOS transistor SW2 and the N-channel MOS transistor SW4 become an OFF state and the power supply to the memory array MA is shut down.

Figure 11:
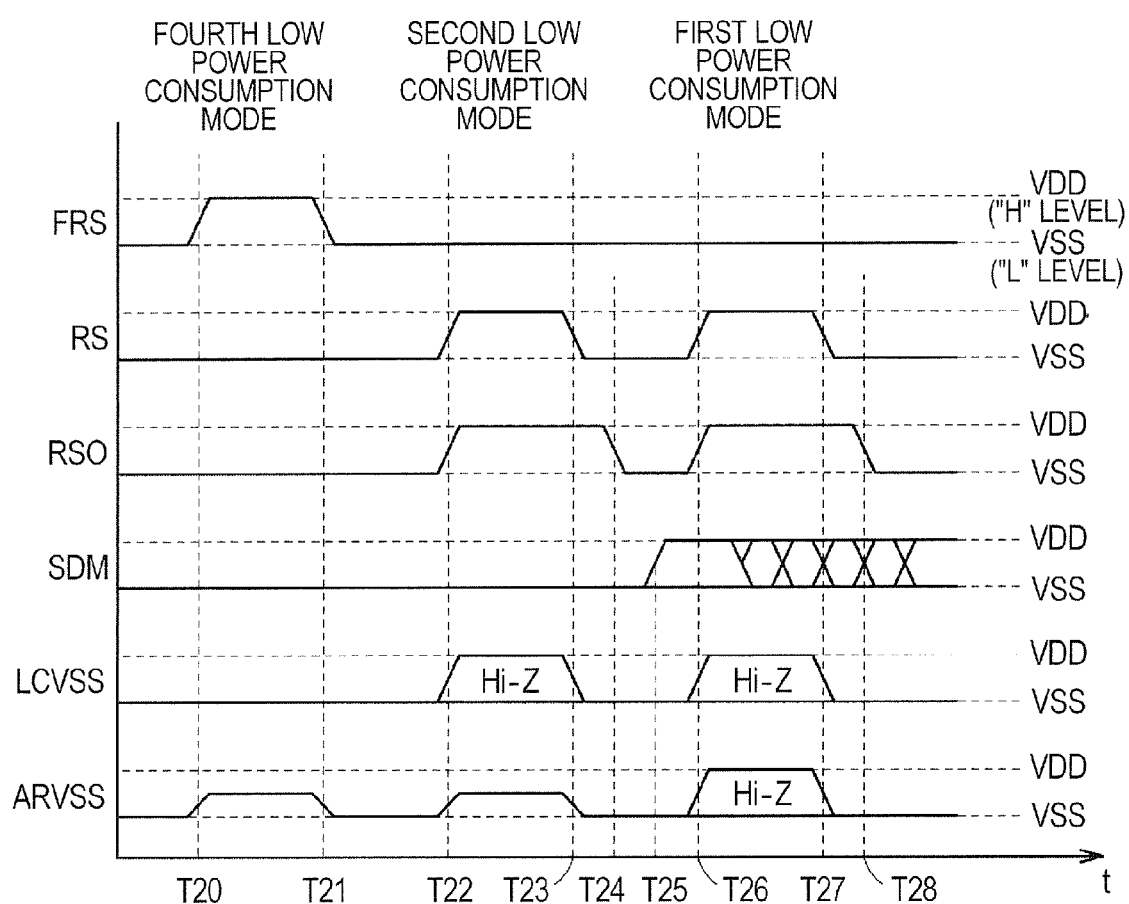
FIG. 11 is a diagram for explaining a timing chart for explaining low power consumption modes of the memory module MMB based on the third embodiment.

FIG. 11 is a diagram for explaining a timing chart for explaining the low power consumption modes of the memory module MMB based on the third embodiment.

As show in FIG. 11, at time T20, a case in which the control signal FRS is activated to "H" level is shown. Accordingly, the P-channel MOS transistor SW3 becomes an OFF state. The N-channel MOS transistor SW4 becomes a diode-coupled state in which the source and the gate are coupled together, and the potential of the memory ground line ARVSS is set to a state in which the potential is a little above the ground voltage VSS (a state in which the potential is high).

The peripheral ground line LCVSS maintains a state of being coupled with the ground voltage VSS.

Thereby, the power supply of the memory array MA is reduced. It is possible to set a fourth low power consumption mode in which the power supply to the peripheral circuit PC is reduced.

At time T21, a case in which the control signal FRS is deactivated is shown. Accordingly, the memory ground line ARVSS is coupled with the ground voltage VSS, the case of which is shown.

A return operation from the fourth low power consumption mode to the normal mode is to restore the power supply to the peripheral circuit. The power to be restored is small and the inrush current is small, so that it is possible to quickly perform the return operation.

At time T22, a case in which the control signal RS is activated to "H" level is shown. Accordingly, the peripheral ground line LCVSS is separated from the ground voltage VSS and the potential of the peripheral ground line LCVSS becomes a high impedance (Hi-Z) state, the case of which is shown.

Further, the N-channel MOS transistor SW4 becomes a diode-coupled state and the memory ground line ARVSS is set to a state in which the memory ground line ARVSS is a little above the ground voltage VSS (a state in which the potential is high).

Thereby, it is possible to set the second low power consumption mode in which the power supply to the peripheral circuit is shut down and the power supply to the memory array is lower than the normal power supply.

At time T23, a case in which the control signal RS is deactivated is shown. Accordingly, the peripheral ground line LCVSS and the memory power source line ARVDD are coupled with the ground voltage VSS, the case of which is shown. Further, a case is shown in which the memory ground line ARVSS is coupled with the ground voltage VSS.

The control signal RSO is a delayed control signal RS, and a case in which the control signal RSO is deactivated at time T24 is shown. The control signal RSO is outputted to the post stage memory module, so that regarding a return operation from the second low power consumption mode to the normal mode, the return operation is performed step by step from a previous stage memory module to a post stage memory module. Therefore, it is possible to alleviate inrush current that occurs when the low power consumption mode is cancelled.

At time T25, a case in which the control signal SDM is activated to "H" level is shown. In this case, the low power consumption mode is not enabled by only the control signal SDM.

At time T26, a case in which the control signal RS is activated to "H" level is shown. Accordingly, the peripheral ground line LCVSS is separated from the ground voltage VSS and the potential of the peripheral ground line LCVSS becomes a high impedance (Hi-Z) state, the case of which is shown.

Further, regarding the memory ground line ARVSS, the N-channel MOS transistor SW6 becomes an ON state and the N-channel MOS transistor SW4 becomes an OFF state. Therefore, the memory ground line ARVSS is separated from the ground voltage VSS and the potential of the memory ground line ARVSS becomes a high impedance (Hi-Z) state, the case of which is shown.

Thereby, the power supply to the peripheral circuit and the memory array is shut down, so that the first low power consumption mode can be set.

At time T27, a case in which the control signal RS is deactivated is shown. Accordingly, the peripheral ground lines LCVSS1 and the LCVSS2 are coupled with the ground voltage VSS, the case of which is shown. Further, a case is shown in which the memory ground line ARVSS is coupled with the ground voltage VSS.

The control signal RSO is a delayed control signal RS, and a case in which the control signal RSO is deactivated at time T28 is shown. The control signal RSO is outputted to the post stage memory module, so that regarding a return operation from the first low power consumption mode to the normal mode, the return operation is performed step by step from a previous stage memory module to a post stage memory module. Therefore, it is possible to alleviate inrush current that occurs when the low power consumption mode is cancelled.

As described above, the setting and the cancelling of the first low power consumption mode of the memory module MMA are performed based on a combination of the first input control signal RS and the second input control signal SDM. Further, the setting and the cancelling of the second low power consumption mode of the memory module MMA are performed based on the input of the first input control signal RS. Further, the setting and the cancelling of the fourth low power consumption mode of the memory module MMA are performed based on the input of the third input control signal FRS.

A return operation from the first and the second low power consumption modes to the normal mode is performed according to the control signal RS and the control signal RSO which is a delayed signal of the control signal RS. In other words, the return operation is performed step by step from a previous stage memory module to a post stage memory module.

That is to say, it is not necessary to generate a delayed signal obtained by delaying the control signal for each of the plurality of low power consumption modes, and by performing the setting and the cancelling of a low power consumption mode based on a combination of the low power consumption mode and one delayed signal, it is possible to alleviate inrush current that occurs when each of the plurality of low power consumption modes is cancelled.

Thereby, it is not necessary to provide a wiring to delay the control signal for each low power consumption mode, it is possible to design a circuit with a simple configuration, and it is possible to reduce the load of designing a product.

Fourth Embodiment

Figure 12:
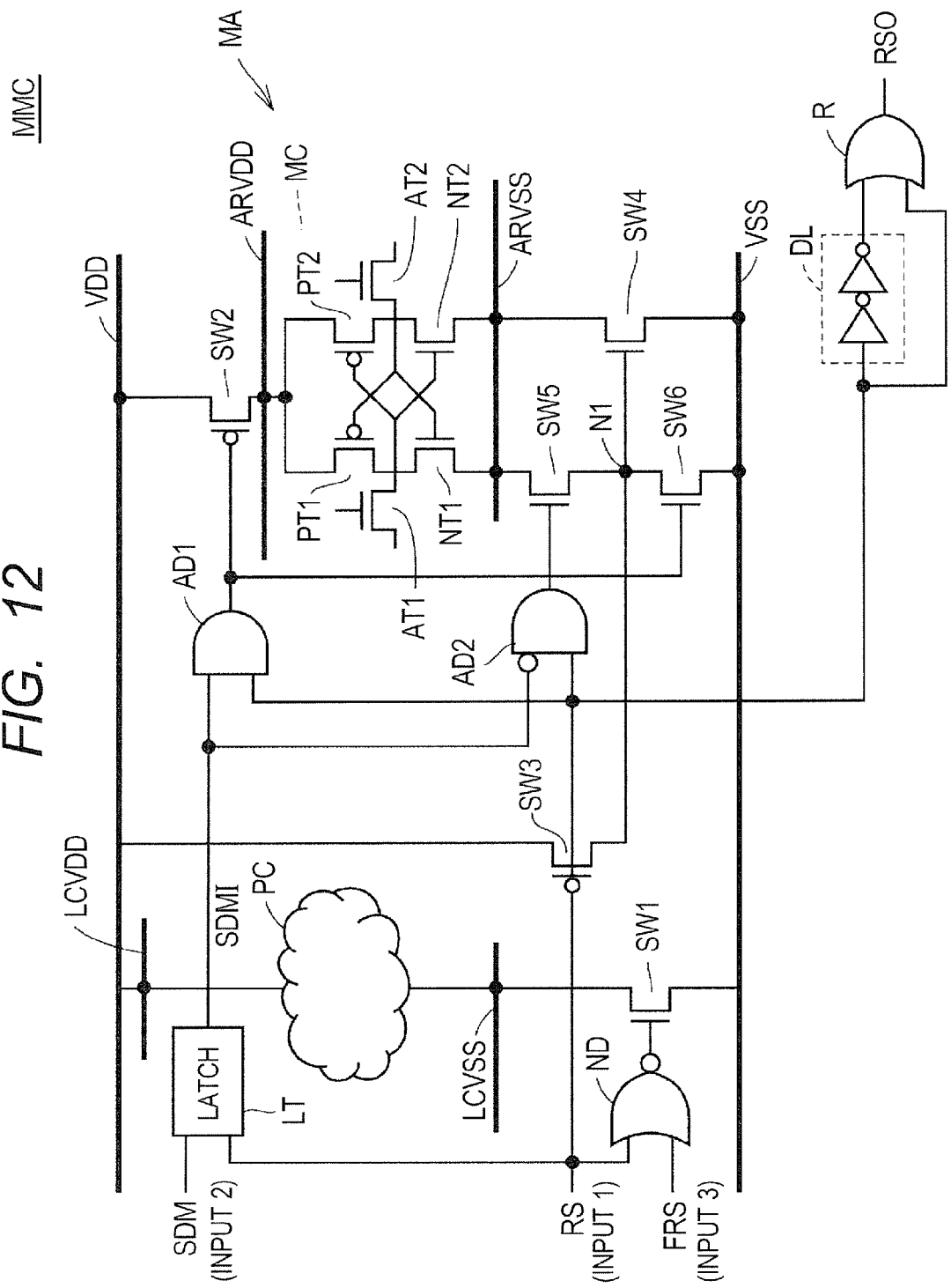
FIG. 12 is a diagram for explaining a circuit configuration related to power supply of the memory module MMC based on a fourth embodiment.

FIG. 12 is a diagram for explaining a circuit configuration related to power supply of a memory module MMC based on a fourth embodiment.

As shown in FIG. 12, the circuit configuration of the memory module MMC is different from the circuit configuration described in FIG. 4 in a point that a latch LT is further provided. The other configuration is the same as the configuration described in FIG. 4, so that the detailed description thereof will not be repeated.

Specifically, the memory power source control circuit VC further includes a latch LT. The latch LT receives inputs of the control signal SDM and the control signal RS.

The latch LT outputs a latched control signal SDMI. The control signal SDMI is outputted to the AND circuits AD1 and AD2.

Figure 13:
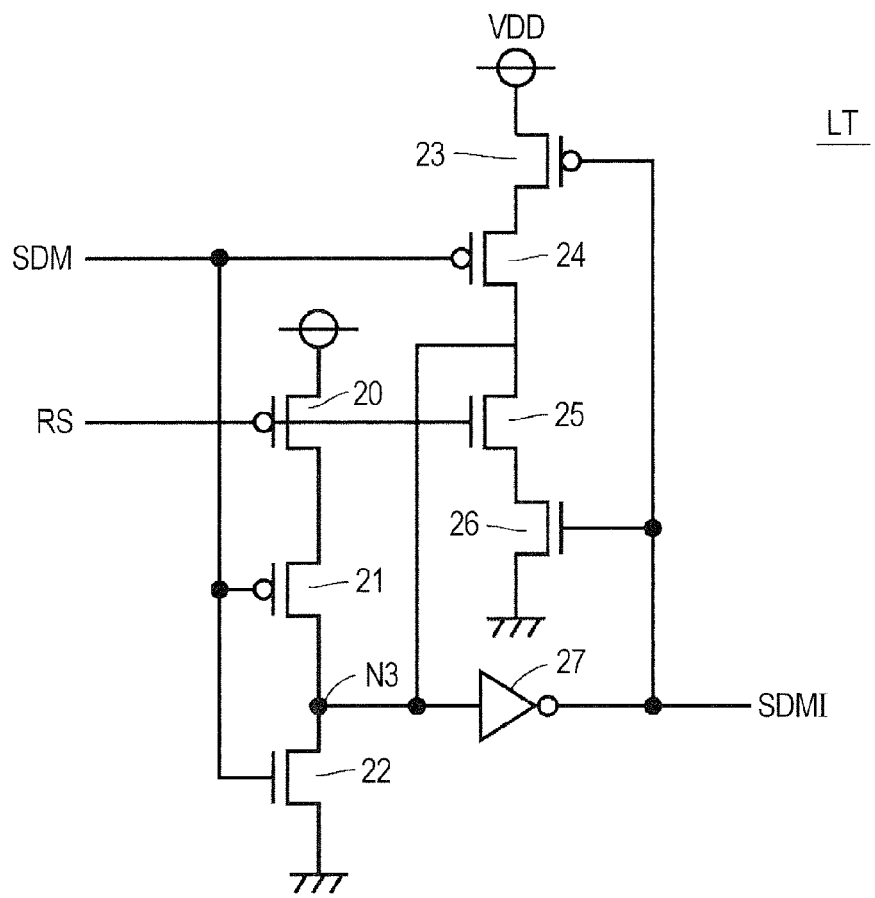
FIG. 13 is a diagram for explaining a configuration of a latch LT based on the fourth embodiment.

FIG. 13 is a diagram for explaining a configuration of the latch LT based on the fourth embodiment.

As shown in FIG. 13, the latch LT includes P-channel MOS transistors 20, 21, 23, and 24, N-channel MOS transistors 22, 25, and 26, and an inverter 27.

The P-channel MOS transistors 20 and 21 are serially coupled between the power source voltage VDD and the node N3. The gate of the P-channel MOS transistor 20 receives an input of the control signal RS. The N-channel MOS transistor 22 is provided between the node N3 and the ground voltage VSS. The gate of the N-channel MOS transistor 22 receives an input of the control signal SDM.

The P-channel MOS transistors 23 and 24 are serially coupled between the power source voltage VDD and the node N3.

The N-channel MOS transistors 25 and 26 are serially coupled between the node N3 and the ground voltage VSS.

The gate of the P-channel MOS transistor 23 and the gate of the N-channel MOS transistor 26 receives an input of an output signal of the inverter 27.

The gate of the P-channel MOS transistor 24 receives an input of the control signal SDM. The gate of the N-channel MOS transistor 25 receives an input of the control signal RS.

The inverter 27 is coupled with the node N3 and outputs the control signal SDMI where the potential level of the node N3 is inverted.

The latch LT operates as a so-called single latch circuit.

Figure 14:
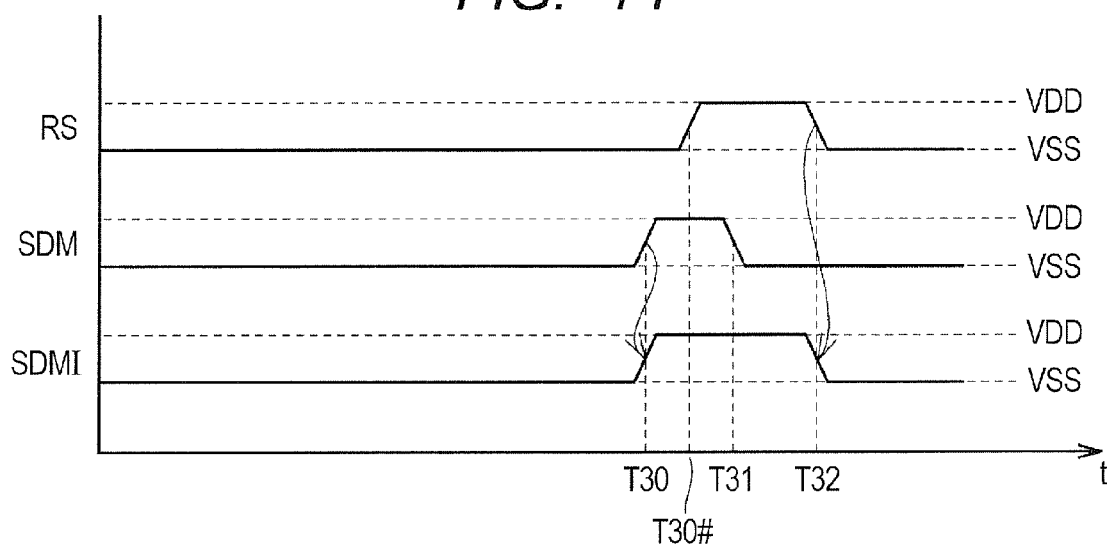
FIG. 14 is a diagram for explaining a timing chart for explaining an operation of the latch LT.

FIG. 14 is a diagram for explaining a timing chart for explaining the operation of the latch LT.

As show in FIG. 14, at time T30, a case in which the control signal SDM is activated to "H" level is shown. Accordingly, the N-channel MOS transistor 22 becomes an ON state. Therefore, the node N3 is set to "L" level and the control signal SDMI is set to "H" level. Accordingly, the N-channel MOS transistor 26 becomes an ON state.

Next, at time T30#, a case in which the control signal RS is activated to "H" level is shown.

Accordingly, the N-channel MOS transistor 25 becomes an ON state.

Therefore, the N-channel MOS transistors 25 and 26 become an ON state, so that a voltage level of the node N3 is fixed to the ground voltage VSS.

Next, at time T31, a case in which the control signal SDM is deactivated is shown. Accordingly, the N-channel MOS transistor 22 becomes an OFF state. The P-channel MOS transistor 21 becomes an ON state. On the other hand, the node N3 is fixed to the ground voltage VSS by the N-channel MOS transistors 25 and 26, so that the control signal SDMI maintains "H" level.

Next, at time T32, a case in which the control signal RS is deactivated is shown. Accordingly, the N-channel MOS transistor 25 becomes an OFF state. The P-channel MOS transistor 20 becomes an ON state. Therefore, the node N3 is coupled with the power source voltage VDD and is set to "H" level. The control signal SDMI is set to "L" level.

By the configuration described above, even when the control signal SDM is activated and then deactivated, the control signal SDMI maintains an activated state until the control signal RS is deactivated. Therefore, the first low power consumption mode is continued.

If the control signal SDMI is deactivated along with deactivation of the control signal SDM, the first low power consumption mode may change to the second low power consumption mode because the control signal RS is set to "H" level. However, by the method described above, it is possible to prevent the first low power consumption mode from changing to the second low power consumption mode.

Thereby, the setting and the cancelling of the first low power consumption mode can be stably performed based on a combination of the first input control signal RS and the second input control signal SDM.

Fifth Embodiment

Figure 15:
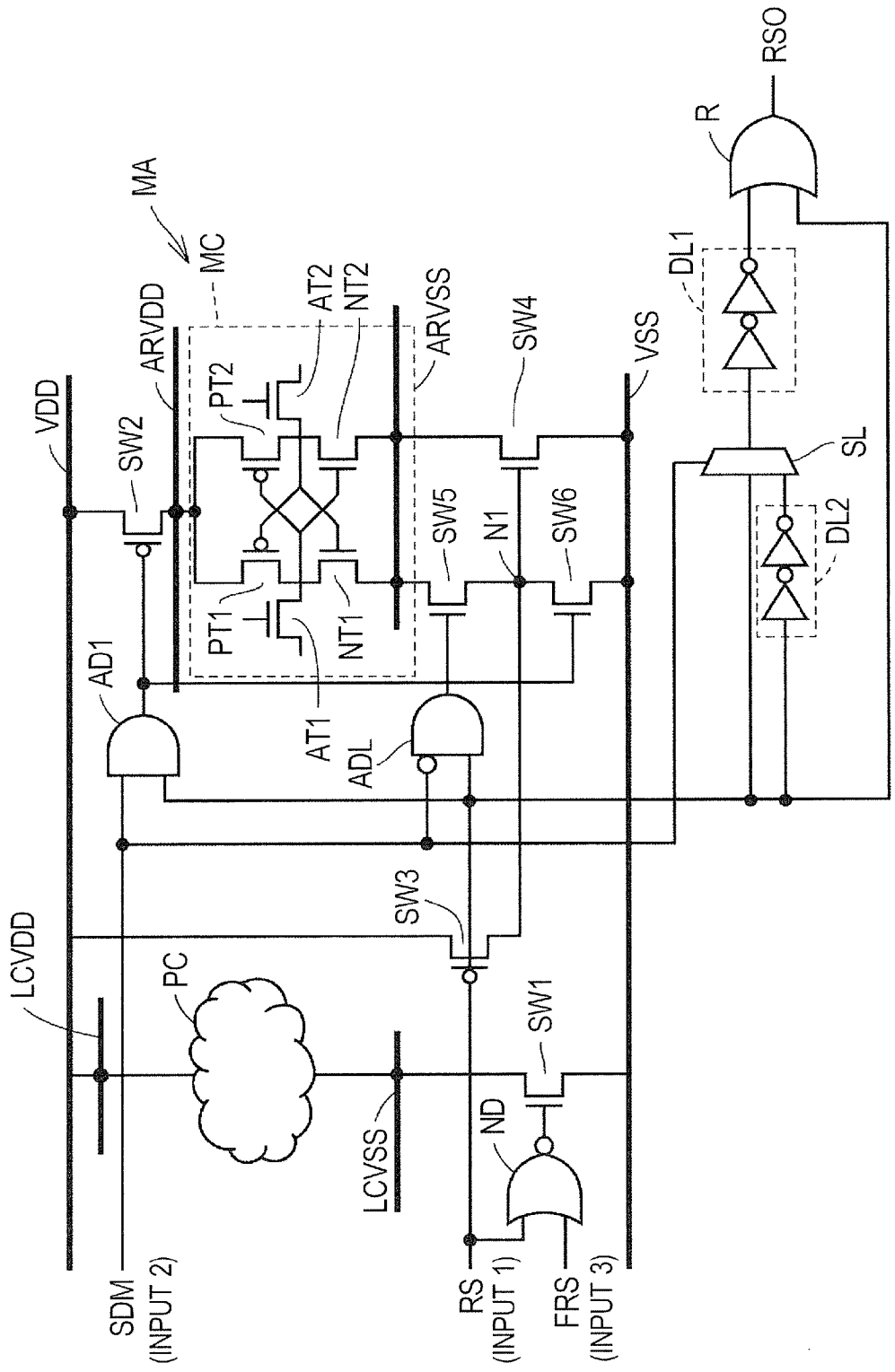
FIG. 15 is a diagram for explaining a circuit configuration related to power supply of a memory module MMD based on a fifth embodiment.

FIG. 15 is a diagram for explaining a circuit configuration related to power supply of a memory module MMD based on a fifth embodiment.

As shown in FIG. 15, the circuit configuration of the memory module MMD is different from the circuit configuration described in FIG. 4 in a point that a propagation path through which the control signal RSO is outputted is changed. The other configuration is the same as the configuration described above, so that the detailed description thereof will not be repeated.

Specifically, delay elements DL1 and DL2 and a selector SL are further provided.

The selector SL receives inputs of the control signal RS and the control signal RS through the delay elements DL2. The selector SL selects one of the inputted signals according to the control signal SDM and outputs the selected signal.

As an example, the selector SL outputs the control signal RS inputted through the delay elements DL2 to the delay element DL1 according to "H" level of the control signal SDM.

On the other hand, the selector SL outputs the control signal RS to the delay element DL1 according to "L" level of the control signal SDM.

Therefore, when the control signal SDM is "H" level, the control signal RSO that is the control signal RS delayed by the two delay elements DL1 and DL2 is outputted.

Figure 16:
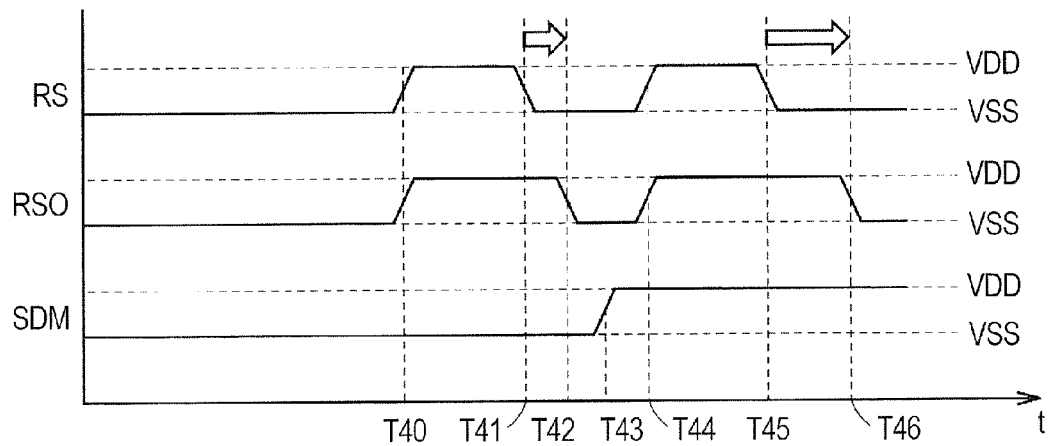
FIG. 16 is a diagram for explaining a timing chart of a control signal RSO adjusted by switching of a selector SL.

FIG. 16 is a diagram for explaining a timing chart of the control signal RSO adjusted by switching of the selector SL.

As show in FIG. 16, at time T40, a case in which the control signal RS is activated to "H" level is shown. In this case, it is assumed that the control signal SDM is deactivated. Therefore, the selector SL outputs the control signal RS to the delay elements DL1.

At time T41, a case in which the control signal RS is deactivated is shown. At time T42, a case is shown in which the control signal RSO that is the control signal RS delayed through the delay elements DL1 is deactivated.

Next, at time T43, a case in which the control signal SDM is activated to "H" level is shown. Therefore, the selector SL switches a path so that the control signal RS delayed by the delay elements DL2 is outputted to the delay elements DL1.

At time T44, a case in which the control signal RS is activated to "H" level is shown.

At time T45, a case in which the control signal RS is deactivated is shown. At time T46, a case is shown in which the control signal RSO that is the control signal RS delayed through the delay elements DL1 and DL2 is deactivated.

It is possible to adjust the amount of delay of the control signal RS by the method described above.

The electric energy of the return operation from the second low power consumption mode is smaller than that from the first low power consumption mode. Therefore, the return operation from the second low power consumption mode can be quickly performed, so that the amount of delay can be small, and the return operation from the first low power consumption mode takes a longer time when considering the inrush current, so that the amount of delay can be large.

Sixth Embodiment

Figure 17:
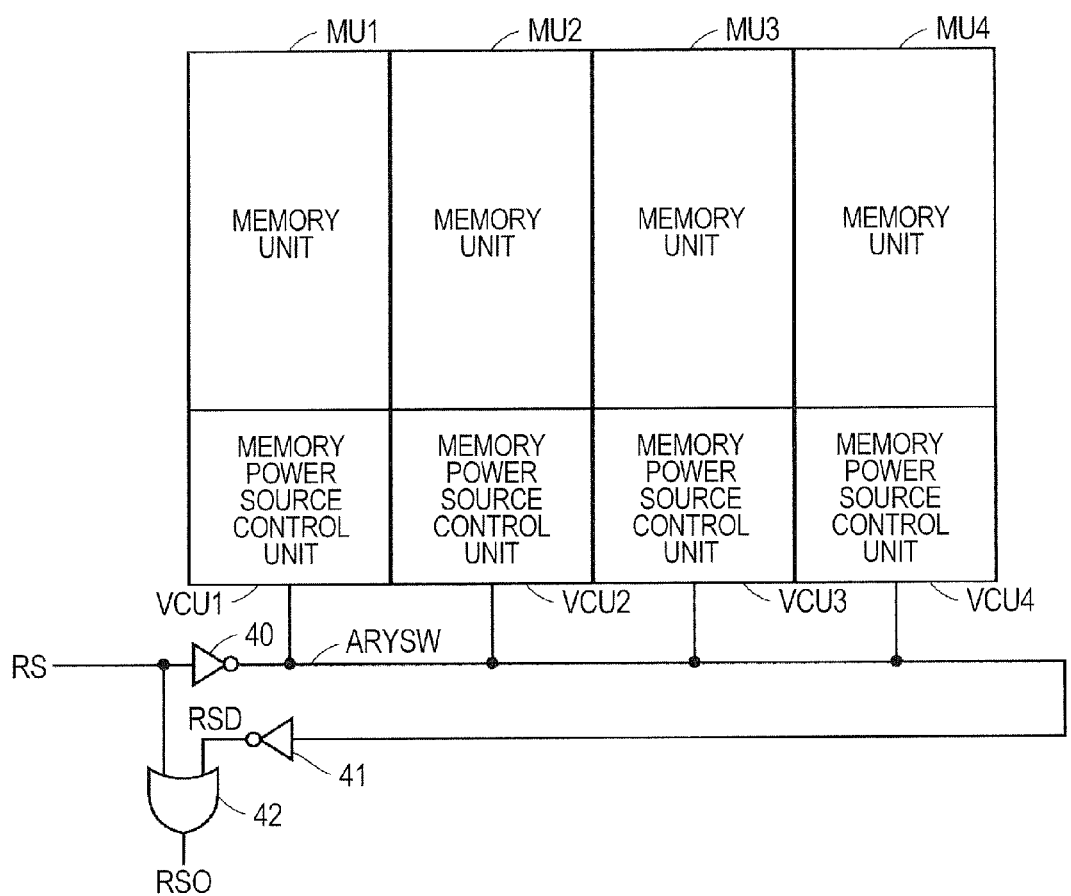
FIG. 17 is a diagram for explaining an outline of a configuration of a memory array based on a sixth embodiment.

FIG. 17 is a diagram for explaining an outline of a configuration of a memory array based on a sixth embodiment.

As show in FIG. 17, a case is shown in which the memory array MA is divided into a plurality of memory units.

Specifically, a case is shown in which the memory array MA is divided into memory units MU1 to MU4 (hereinafter also collectively referred to as memory units MU).

Further, a case is shown in which the memory power source control circuit VC is divided for each memory unit.

Specifically, a case is shown in which memory power source control units VCU1 to VCU4 (hereinafter also collectively referred to as memory power source control units VCU) are provided corresponding to the memory units MU1 to MU4, respectively.

An OR circuit 42 receives the control signal RS and a delayed signal of the control signal RS through inverters 40 and 41 and outputs an OR logical operation result of the received signals as the control signal RSO. A control line ARYSW that controls the memory ground line ARVSS is provided between the inverters 40 and 41.

Figure 18:
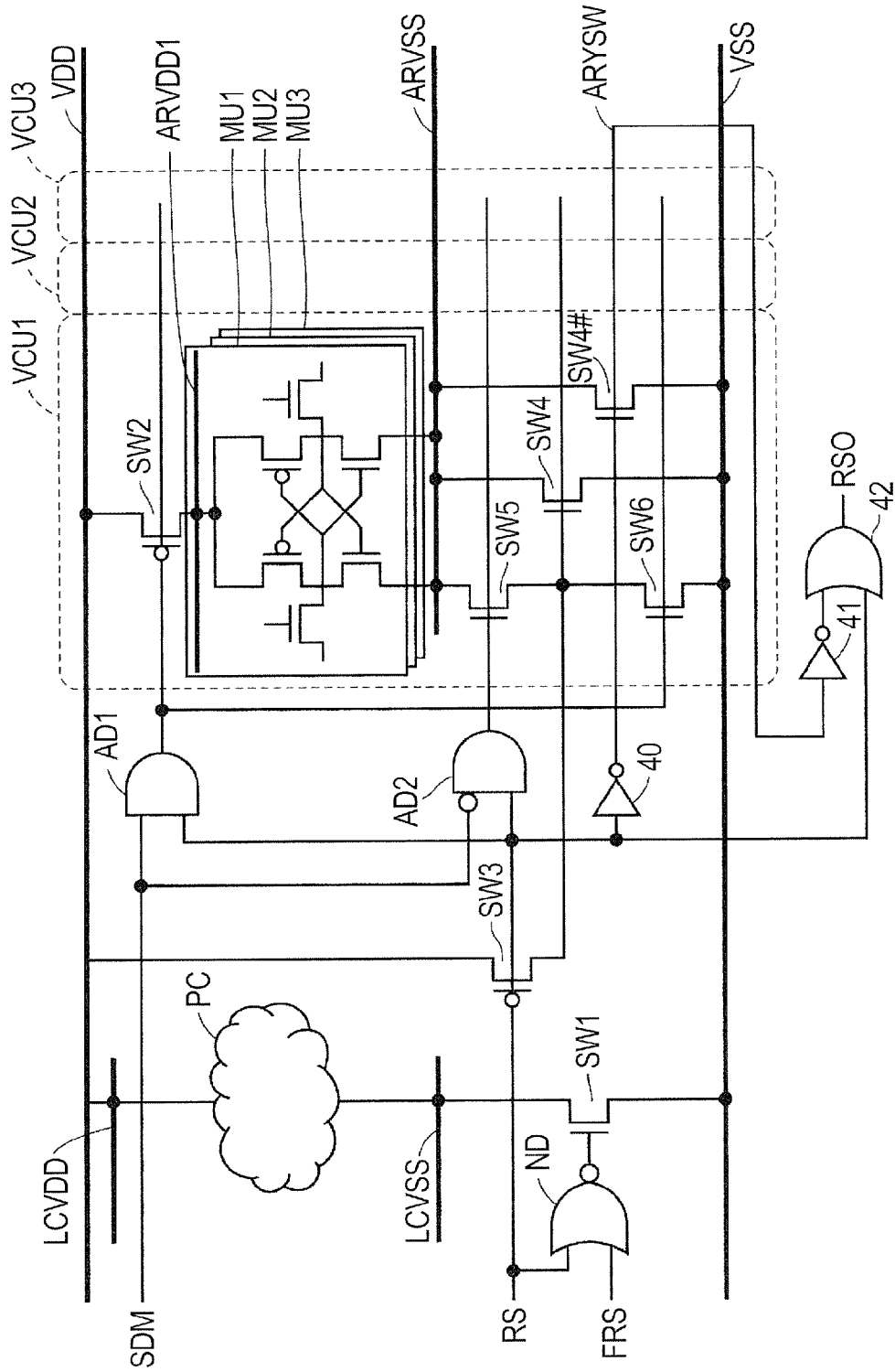
FIG. 18 is a diagram for explaining a circuit configuration related to power supply of a memory module MME based on the sixth embodiment.

FIG. 18 is a diagram for explaining a circuit configuration related to power supply of a memory module MME based on the sixth embodiment.

As shown in FIG. 18, the circuit configuration of the memory module MME is different from the circuit configuration described in FIG. 4 in a point that the memory array MA is divided into a plurality of memory units MU as described above. Further, the memory power source control unit VCU is provided corresponding to each memory unit MU.

A configuration of each memory power source control unit VCU is different from the configuration in FIG. 4 in a point that an N-channel MOS transistor SW4# is further provided. The N-channel MOS transistor SW4# is provided between the memory ground line ARVSS and the ground voltage VSS. The gate of the N-channel MOS transistor SW4# receives an input of an inversion signal of the control signal RS through the inverter 40. The other configuration is the same as the configuration in FIG. 4. The control line ARYSW that propagates an output signal of the inverter 40 is commonly provided to each memory power source control unit VCU. It is assumed that each N-channel MOS transistor SW4# is a large-size transistor.

Figure 19:
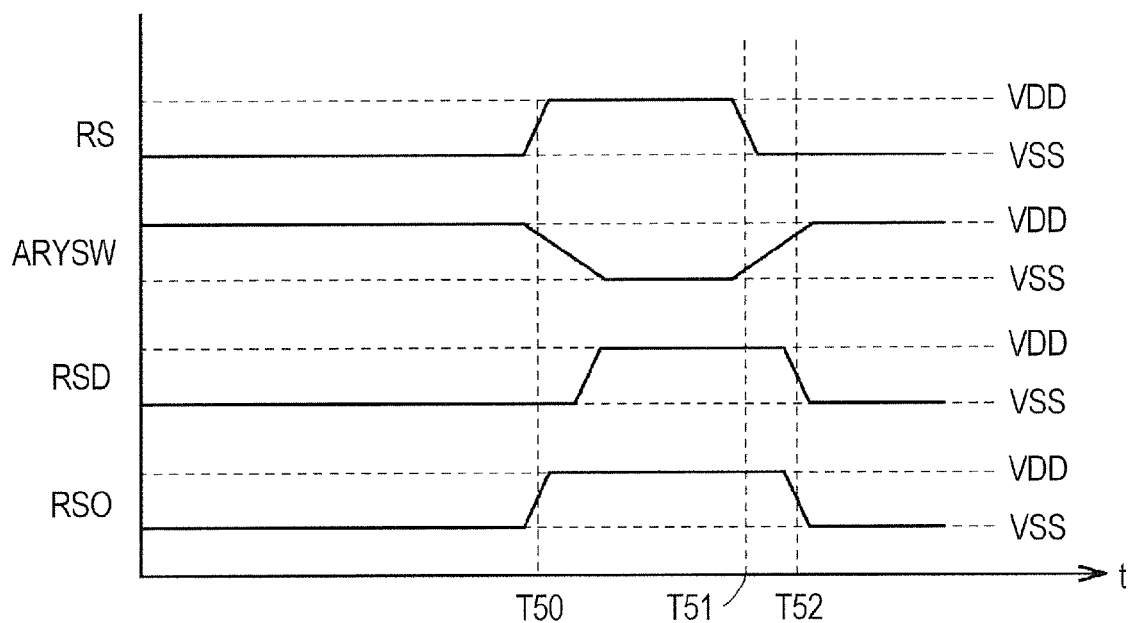
FIG. 19 is a diagram for explaining a timing chart of control signals based on the sixth embodiment.

FIG. 19 is a diagram for explaining a timing chart of control signals based on the sixth embodiment.

As show in FIG. 19, at time T50, a case in which the control signal RS is activated to "H" level is shown. In this case, the potential of the control line ARYSW gradually decreases from "H" level to "L" level through the inverter 40 by a capacity load of the N-channel MOS transistor SW4#.

The control signal RSO is activated to "H" level at substantially the same timing as the rise of the control signal RS.

The control signal RSD is a delayed signal obtained by delaying the control signal RS according to a capacity load of the inverters 40 and 41 and the control line ARYSW.

The control signal RSO is deactivated due to fall ("L" level) of the control signal RSD.

By the configuration described above, the capacity load of the control line ARYSW affects the amount of delay, so that it is possible to adjust the amount of delay according to the characteristics (capacity load) of the memory module. For example, when the number of memory units MU is large, the amount of delay becomes large, and when the number of memory units MU is small, the amount of delay becomes small.

Seventh Embodiment

Figure 20:
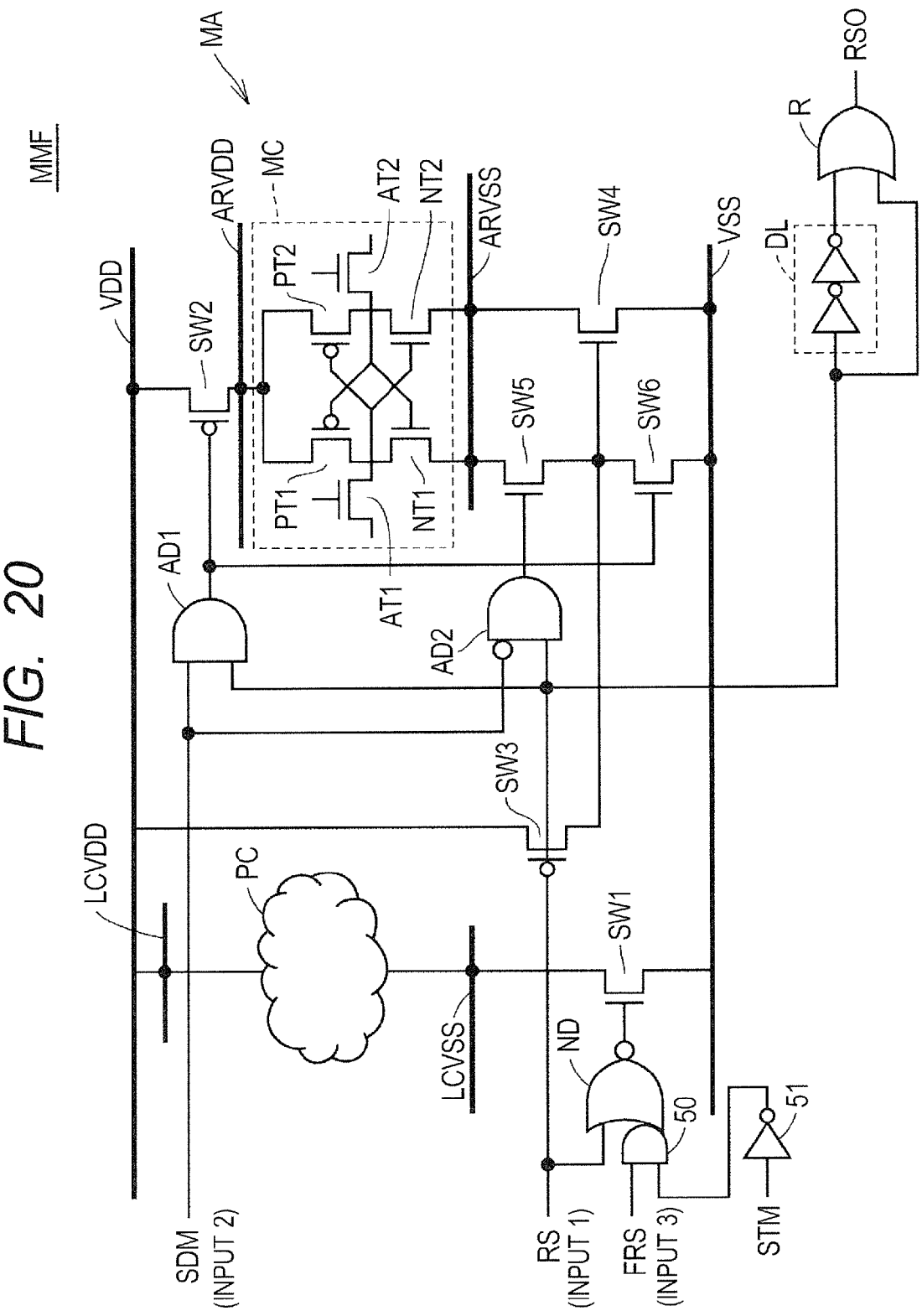
FIG. 20 is a diagram for explaining a circuit configuration related to power supply of a memory module MMF based on a seventh embodiment.

FIG. 20 is a diagram for explaining a circuit configuration related to power supply of a memory module MMF based on a seventh embodiment.

As shown in FIG. 20, the memory module MMF is different from the memory module MM described in FIG. 4 in a point that an AND circuit 50 is further provided. The other configuration is the same as the configuration described in FIG. 4, so that the detailed description thereof will not be repeated.

The AND circuit 50 receives inputs of a test mode signal STM through an inverter 51 and the control signal FRS and outputs an AND logical operation result of the received inputs to the NOR circuit NR.

The test mode signal STM is a signal that is inputted when a predetermined test mode is performed. The test mode signal STM is set to "L" level in the initial state, and the test mode signal STM is set to "H" level in the test mode.

Therefore, when the test mode signal STM is set to "H" level, even if the control signal FRS is activated, the output of the AND circuit 50 maintains a state of being set to "L" level. Therefore, when performing the predetermined test mode, transition to the third low power consumption mode according to the control signal FRS is inhibited.

It is possible to reliably perform processing in the predetermined test mode by the method described above.

Eighth Embodiment

Figure 21:
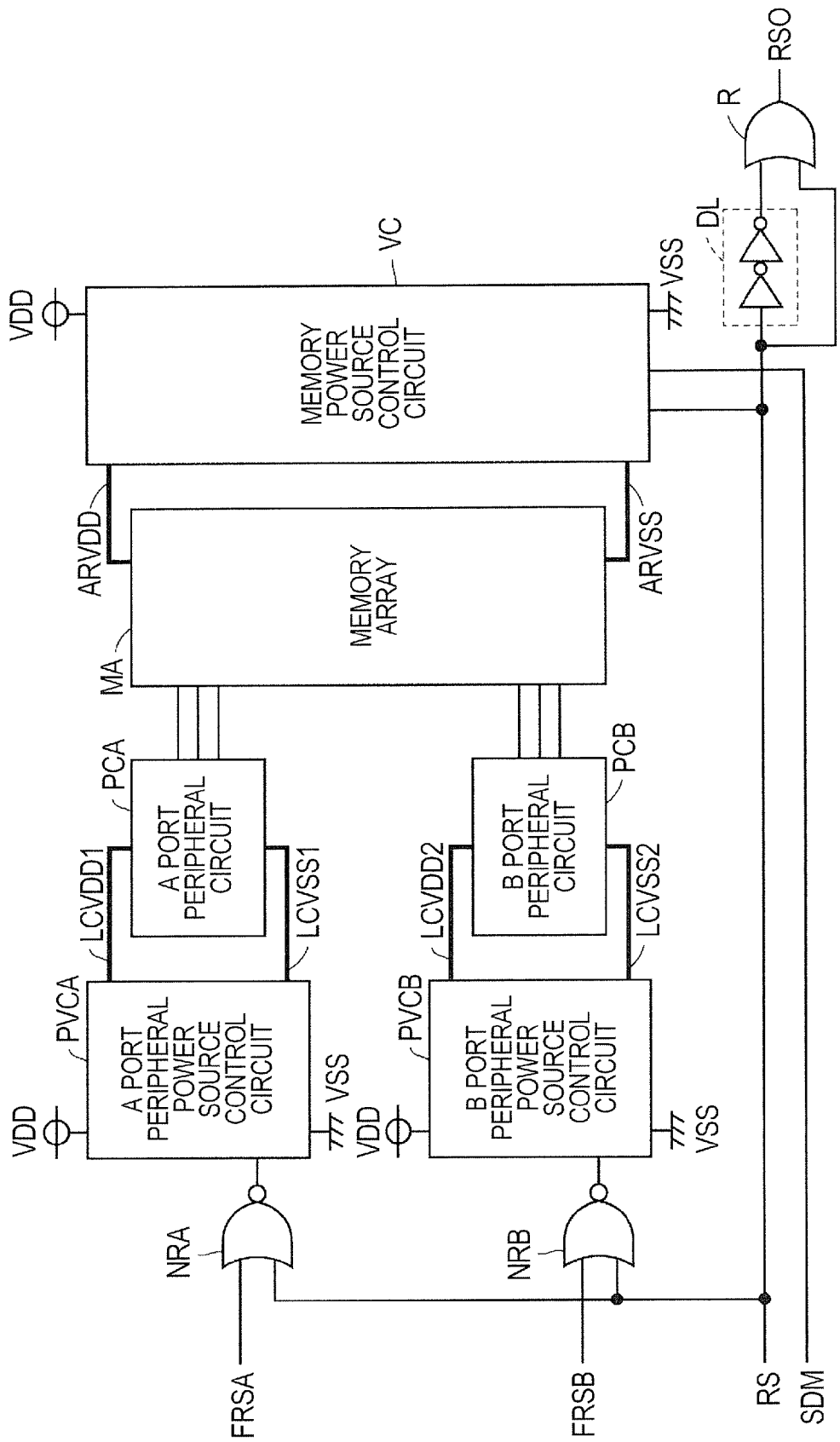
FIG. 21 is a diagram for explaining functional blocks of a memory module MMG based on an eighth embodiment.

FIG. 21 is a diagram for explaining functional blocks of a memory module MMG based on an eighth embodiment.

As shown in FIG. 21, a case is shown in which the memory module MMG is provided with peripheral circuits for a memory array of independent two ports (A port and B port) as compared with the memory module MM described in FIG. 3.

In this example, a peripheral circuit PCA of the A port and a peripheral circuit PCB of the B port are provided and a peripheral power source control circuit is independently provided corresponding to each peripheral circuit.

Specifically, an A port peripheral power source control circuit PVCA that controls power supply of the peripheral circuit of the A port and a B port peripheral power source control circuit PVCB that controls power supply of the peripheral circuit of the B port are provided. The configuration of each peripheral power source control circuit is the same as that described in the first embodiment and the like.

Further, a NOR circuit NRA is provided corresponding to the A port peripheral power source control circuit PVCA of the A port and the A port peripheral power source control circuit PVCA is controlled based on a NOR logical operation result of a control signal FRSA for the A port and the control signal RS.

Further, a NOR circuit NRB is provided corresponding to the B port peripheral power source control circuit PVCB of the B port and the B port peripheral power source control circuit PVCB is controlled based on a NOR logical operation result of a control signal FRSB for the B port and the control signal RS.

By the configuration described above, it is possible to independently set and cancel a low power consumption mode on a memory array of a plurality of ports.

Figure 22:
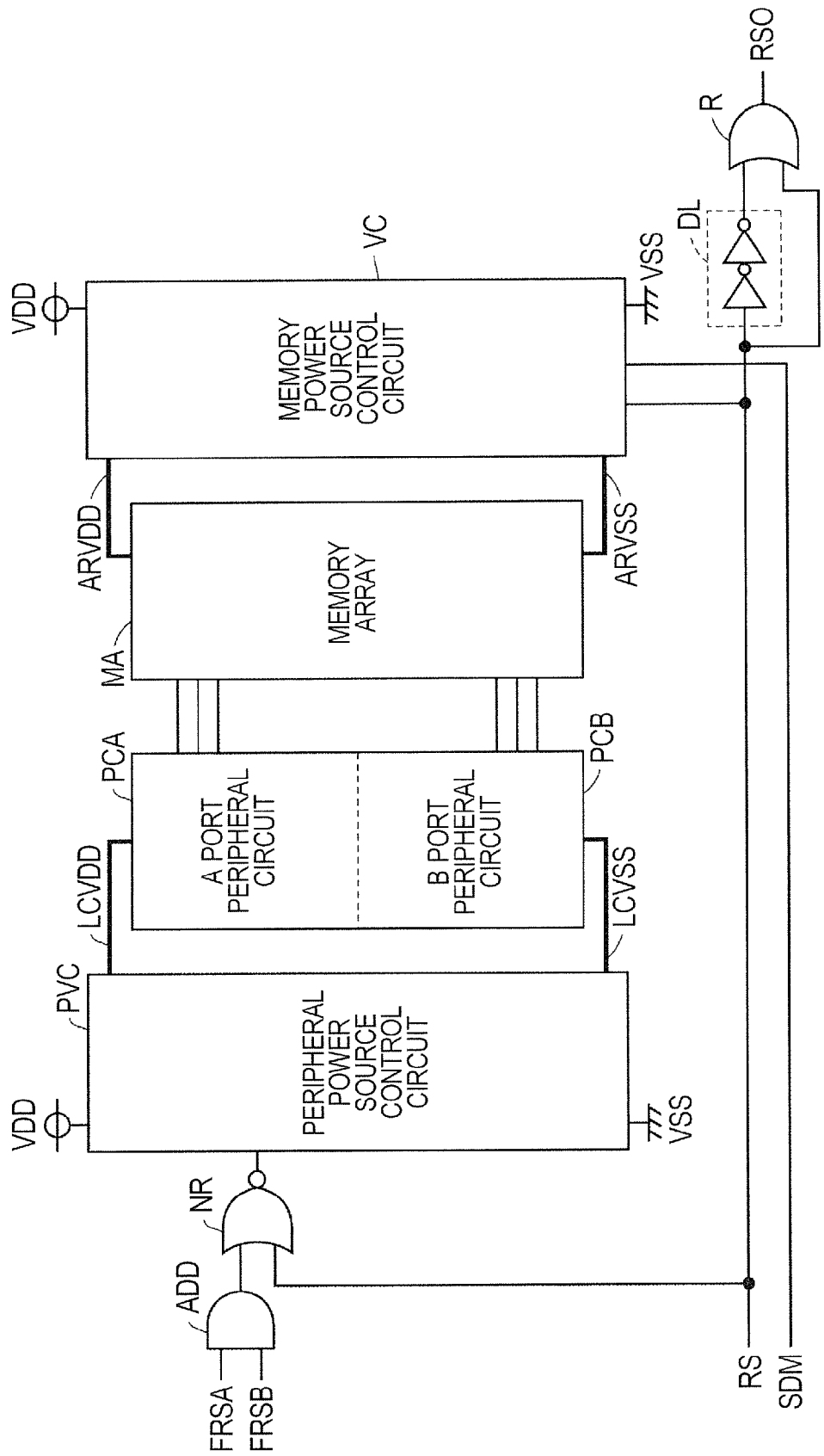
FIG. 22 is a diagram for explaining functional blocks of a memory module MMG# based on another aspect of the eighth embodiment.

FIG. 22 is a diagram for explaining functional blocks of a memory module MMG# based on another aspect of the eighth embodiment.

As shown in FIG. 22, a case is shown in which the memory module MMG# is provided with peripheral circuits for a memory array of independent two ports (A port and B port) as compared with the memory module MM described in FIG. 3.

In this example, the peripheral circuit PCA of the A port and the peripheral circuit PCB of the B port are provided and a common peripheral power source control circuit PVC is provided corresponding to each peripheral circuit.

Specifically, the configuration of the peripheral power source control circuit is the same as that described in the first embodiment and the like.

When the common peripheral power source control circuit is used, the control signal FRSA and the control signal FRSB are inputted into an AND circuit ADD and an AND logical operation result is outputted to the NOR circuit NR.

The peripheral power source control circuit PVC is controlled based on a NOR logical operation result of the NOR circuit NR that receives inputs of an output of the AND circuit ADD and the control signal RS.

By the configuration described above, it is possible to set and cancel the third low power consumption mode when both the control signals FRSA and FRSB are activated on a memory array of a plurality of ports.

Ninth Embodiment

Figure 23:
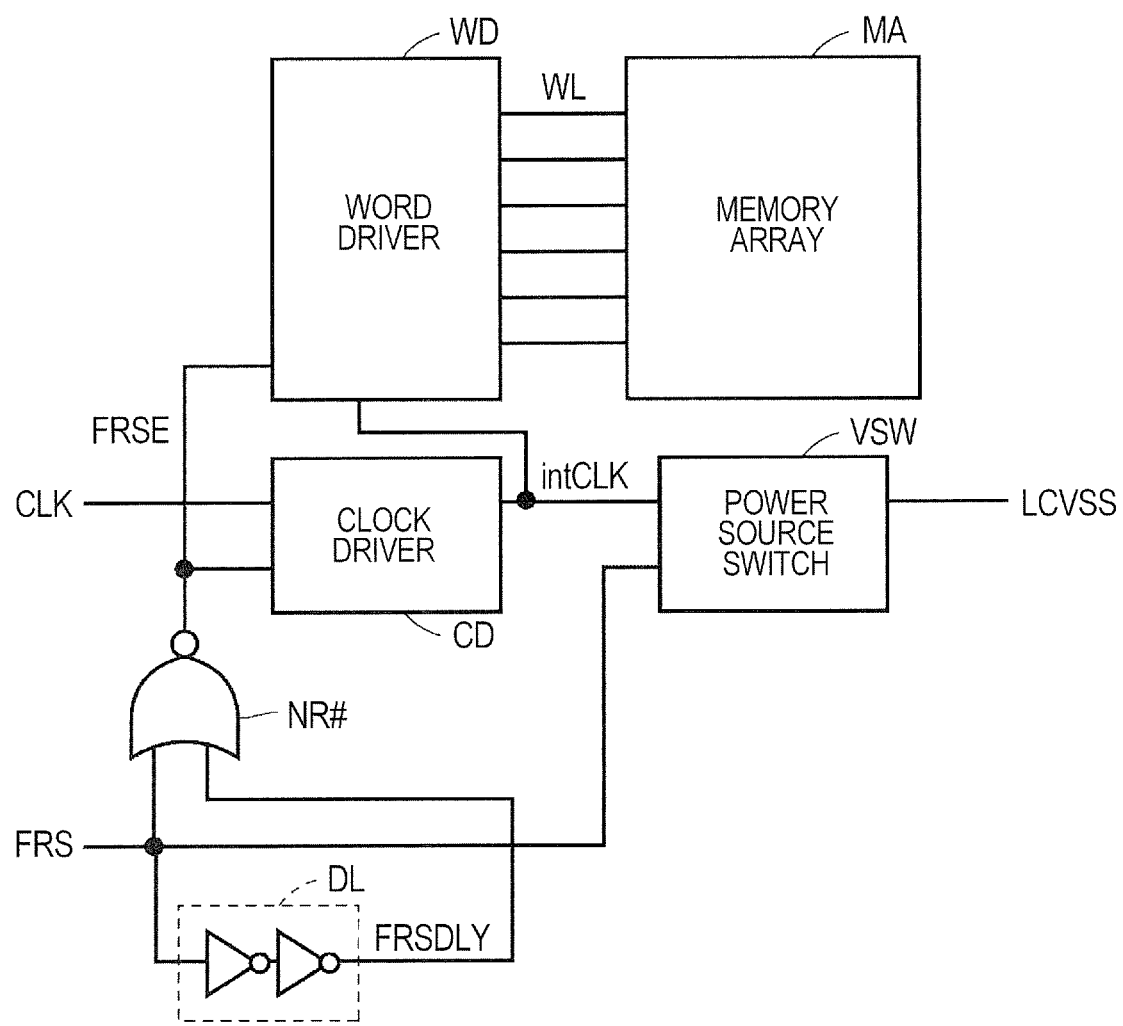
FIG. 23 is a diagram for explaining functional blocks of a memory array and peripheral circuits based on a ninth embodiment.

FIG. 23 is a diagram for explaining functional blocks of a memory array and peripheral circuits based on a ninth embodiment.

FIG. 23 shows functional blocks of a memory array MA and peripheral circuits.

As the peripheral circuits, a word driver WD that drives word lines WL of the memory array MA, a clock driver CD that drives a clock signal, and a power source switch VSW that controls power supply to the peripheral circuits are provided.

The clock driver CD receives an input of a clock signal CLK and drives an internal clock intCLK according to a control signal FRSE. When the control signal FRSE is activated ("H" level), the clock driver CD drives the internal clock intCLK.

When the control signal FRSE is activated ("H" level), the word driver WD drives the word lines WL according to an instruction.

The power source switch VSW controls power supply of the peripheral circuits based on the control signal FRS and the internal clock intCLK. As an example, the power source switch VSW sets a voltage level of the peripheral ground line LCVSS. Specifically, when the control signal FRS is "L" level, the power source switch VSW couples the peripheral ground line LCVSS with the ground voltage VSS, and when the control signal FRS is "H" level, the power source switch VSW separates the peripheral ground line LCVSS from the ground voltage VSS.

The NOR circuit NR# receives inputs of the control signal FRS and a control signal FRSDLY that is a signal obtained by delaying the control signal FRS and outputs a NOR logical operation result of these signals to the word driver WD and the clock driver CD.

Figure 24:
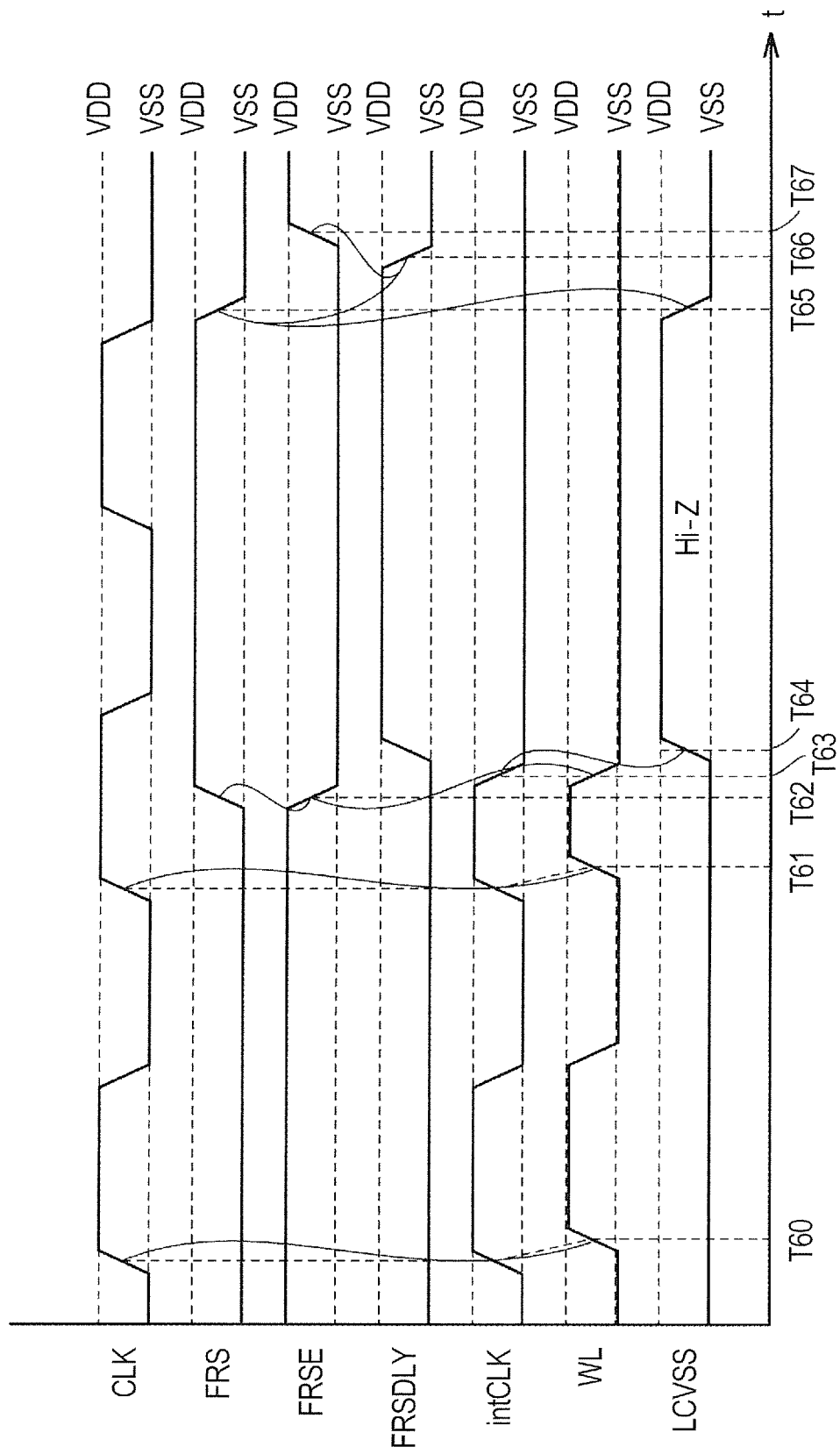
FIG. 24 is a diagram for explaining a timing chart of various control signals based on the ninth embodiment.

FIG. 24 is a diagram for explaining a timing chart of various control signals based on the ninth embodiment.

As show in FIG. 24, at time T60, when the control signal FRSE is "H" level, the internal clock intCLK and the word lines WL are driven in synchronization with the clock signal CLK.

At time T61, in the same manner, the internal clock intCLK and the word lines WL are driven in synchronization with the clock signal CLK.

At time T62, when the control signal FRS is activated to "H" level, the control signal FRSE is set to "L" level. Accordingly, at time T63, the drive of the word lines WL and the internal clock intCLK is stopped.

At time T64, the peripheral ground line LCVSS is separated from the ground voltage VSS and is set to a high impedance (Hi-Z) state. The power source switch VSW is controlled by the control signal FRS and the internal clock intCLK and controls the coupling between the peripheral ground line LCVSS and the ground voltage VSS, so that it is possible to prevent data corruption due to unstable power source.

At time T65, a case in which the control signal FRS is deactivated is shown.

Accordingly, the peripheral ground line LCVSS is coupled with the ground voltage VSS, and the low power consumption mode is cancelled.

The word driver WD and the clock driver CD are driven after the control signal FRSE is activated. The control signal FRSE is set to "H" level when the control signal FRSDLY is deactivated to "L" level. The control signal FRSDLY is a delayed signal of the control signal FRSE, so that the word driver WD and the clock driver CD are activated after an return operation is completed. Then, the word line WL and the internal clock intCLK are driven. Therefore, it is possible to prevent data corruption due to unstable power source.

Although the disclosure has been specifically described based on the embodiments the disclosure is not limited to the embodiments and needless to say that the disclosure can be variously modified without departing from the scope of the disclosure.

What is claimed is:

1. A semiconductor storage device comprising:
a plurality of memory modules, each of the memory modules being configured to receive first and second control signals through respective first and second signal inputs, and being able to be set into a plurality of low power consumption modes based on the first and second control signals,
wherein at least some of the memory modules of the plurality of memory modules have a propagation path through which an inputted first control signal is propagated to another memory module,
wherein the second control signal is inputted into each of the plurality of memory modules in parallel,
wherein setting each of the plurality of memory modules into a first low power consumption mode is performed based on a combination of the first control signal that is propagated through the propagation path and the second control signal,
wherein setting each of the plurality of memory modules into a second low power consumption mode is sequentially performed according to the first control signal that is propagated through the propagation path, and
wherein regions of the memory modules that are shut down in the second low power consumption mode are different from regions of the memory modules that are shut down in the first low power consumption mode.

2. The semiconductor storage device according to claim 1, wherein each of the plurality of memory modules receives an input of a third control signal for setting the plurality of memory modules into a third low power consumption mode, which is different from the first and the second low power consumption modes.

3. The semiconductor storage device according to claim 1, wherein each memory module includes a memory region and a peripheral region, and
wherein in the second low power consumption mode, a power source of a partial region of the peripheral region of each memory module is shut down according to the first control signal.

4. The semiconductor storage device according to claim 2, wherein each memory module includes a memory region and a peripheral region,
wherein in the second low power consumption mode, a power of the peripheral region is shut down and a power of the memory region is reduced, and
wherein in the third low power consumption mode, only the power of the memory region is reduced.

5. The semiconductor storage device according to claim 1, wherein the first low power consumption mode is set according to activation of the second control signal and thereafter cancelled according to deactivation of the first control signal without depending on the second control signal.

6. The semiconductor storage device according to claim 1, wherein each memory module further includes an adjusting circuit that adjusts an amount of delay of the first control signal through the propagation path.

7. The semiconductor storage device according to claim 6, wherein the adjusting circuit adjusts the amount of delay of the first control signal through the propagation path based on a control signal of a switch that controls a power source line of each memory module.

8. The semiconductor storage device according to claim 1, wherein the plurality of memory modules include an inhibiting circuit that inhibits reception of the third control signal during a test mode.

9. The semiconductor storage device according to claim 2, wherein each memory module includes a memory region and a peripheral region,
wherein the memory region includes a plurality of ports that can be controlled independently,
wherein the peripheral region is divided corresponding to each of the ports,
wherein the third control signal is provided for each port, and
wherein in the third low power consumption mode, the power source is shut down for each of the peripheral region that is divided for each port.

10. A semiconductor storage device comprising:
a plurality of memory modules, each of the memory modules being configured to receive first and second control signal through respective first and second signal inputs, and being able to be set into a plurality of low power consumption modes based on the first and second control signals,
wherein each memory module includes a memory region and a peripheral region,
wherein some of the memory modules of the plurality of memory modules have a propagation path through which an inputted first control signal is propagated to another memory module,
wherein the second control signal is inputted into each of the plurality of memory modules in parallel,
wherein each memory module is set to a first low power consumption mode in which power of the memory region and the peripheral region is shut down based on a combination of the first control signal that is propagated through the propagation path and the second control signal, and
wherein each memory module is sequentially set to a second low power consumption mode in which the power of the peripheral region is shut down and the power of the memory region is reduced according to the first control signal that is propagated through the propagation path.

* * * * *